United States Patent
Nakanishi et al.

(10) Patent No.: US 10,847,689 B2
(45) Date of Patent: Nov. 24, 2020

(54) SEMICONDUCTOR LIGHT EMITTING DEVICE AND METHOD OF MANUFACTURING THE SAME

(71) Applicant: ROHM CO., LTD., Kyoto (JP)

(72) Inventors: Yasuo Nakanishi, Kyoto (JP); Yasunobu Shoji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 91 days.

(21) Appl. No.: 15/861,907

(22) Filed: Jan. 4, 2018

(65) Prior Publication Data
US 2018/0240948 A1 Aug. 23, 2018

(30) Foreign Application Priority Data
Feb. 17, 2017 (JP) ................. 2017-027881

(51) Int. Cl.
| | |
|---|---|
| H01L 33/48 | (2010.01) |
| H01L 33/56 | (2010.01) |
| H01L 33/62 | (2010.01) |
| H01L 33/60 | (2010.01) |
| H01L 31/02 | (2006.01) |
| H01L 31/0203 | (2014.01) |
| H01L 31/0236 | (2006.01) |
| H01L 33/36 | (2010.01) |

(Continued)

(52) U.S. Cl.
CPC .............. *H01L 33/56* (2013.01); *H01L 23/48* (2013.01); *H01L 33/0095* (2013.01); *H01L 33/486* (2013.01); *H01L 2224/48091* (2013.01); *H01L 2224/48465* (2013.01); *H01L 2224/97* (2013.01); *H01L 2924/181* (2013.01)

(58) Field of Classification Search
CPC ........................... H01L 33/0095; H01L 33/48
See application file for complete search history.

(56) References Cited

U.S. PATENT DOCUMENTS

| | | | |
|---|---|---|---|
| 6,949,771 B2* | 9/2005 | Yoganandan | ......... H01L 33/486 257/99 |
| 2010/0148196 A1* | 6/2010 | Kamada | .................... F21K 9/00 257/98 |

(Continued)

FOREIGN PATENT DOCUMENTS

JP          2015-115432         6/2015

*Primary Examiner* — Omar F Mojaddedi
(74) *Attorney, Agent, or Firm* — Hamre, Schumann, Mueller & Larson, P.C.

(57) ABSTRACT

A semiconductor light emitting device includes: a semiconductor light emitting element; a sealing resin covering the light emitting element; and a support member including a base and supporting the light emitting element and the sealing resin, the base including a base main surface facing one side of first direction, a base back surface facing the other side of the first direction, a pair of first base side surfaces opposite each other in second direction orthogonal to the first direction, and a pair of second base side surfaces opposite each other in third direction orthogonal to the first and second directions, wherein the support member includes a raised plane raised from the base main surface in the first direction, and wherein the plane is exposed from the sealing resin and includes a portion extending from one edge to the other edge in the third direction when viewed in the first direction.

21 Claims, 22 Drawing Sheets

(51) Int. Cl.
*H01L 23/48* (2006.01)
*H01L 33/00* (2010.01)

(56) References Cited

U.S. PATENT DOCUMENTS

| | | | |
|---|---|---|---|
| 2012/0074445 A1* | 3/2012 | Shimonishi | H01L 33/60 257/98 |
| 2012/0205710 A1* | 8/2012 | Kobayakawa | H01L 33/486 257/99 |
| 2015/0162456 A1* | 6/2015 | Toyama | H01L 31/0203 257/99 |

* cited by examiner

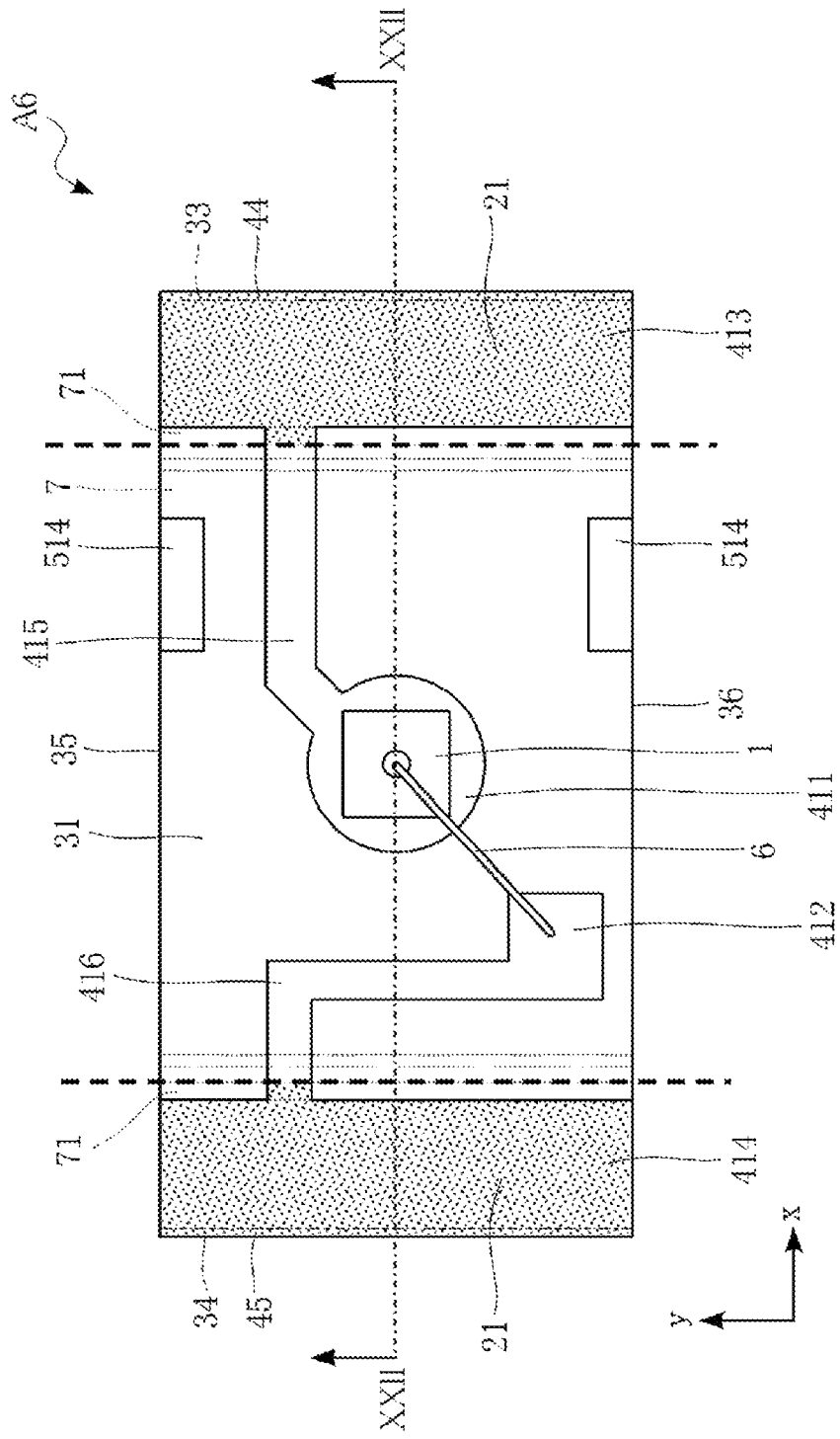

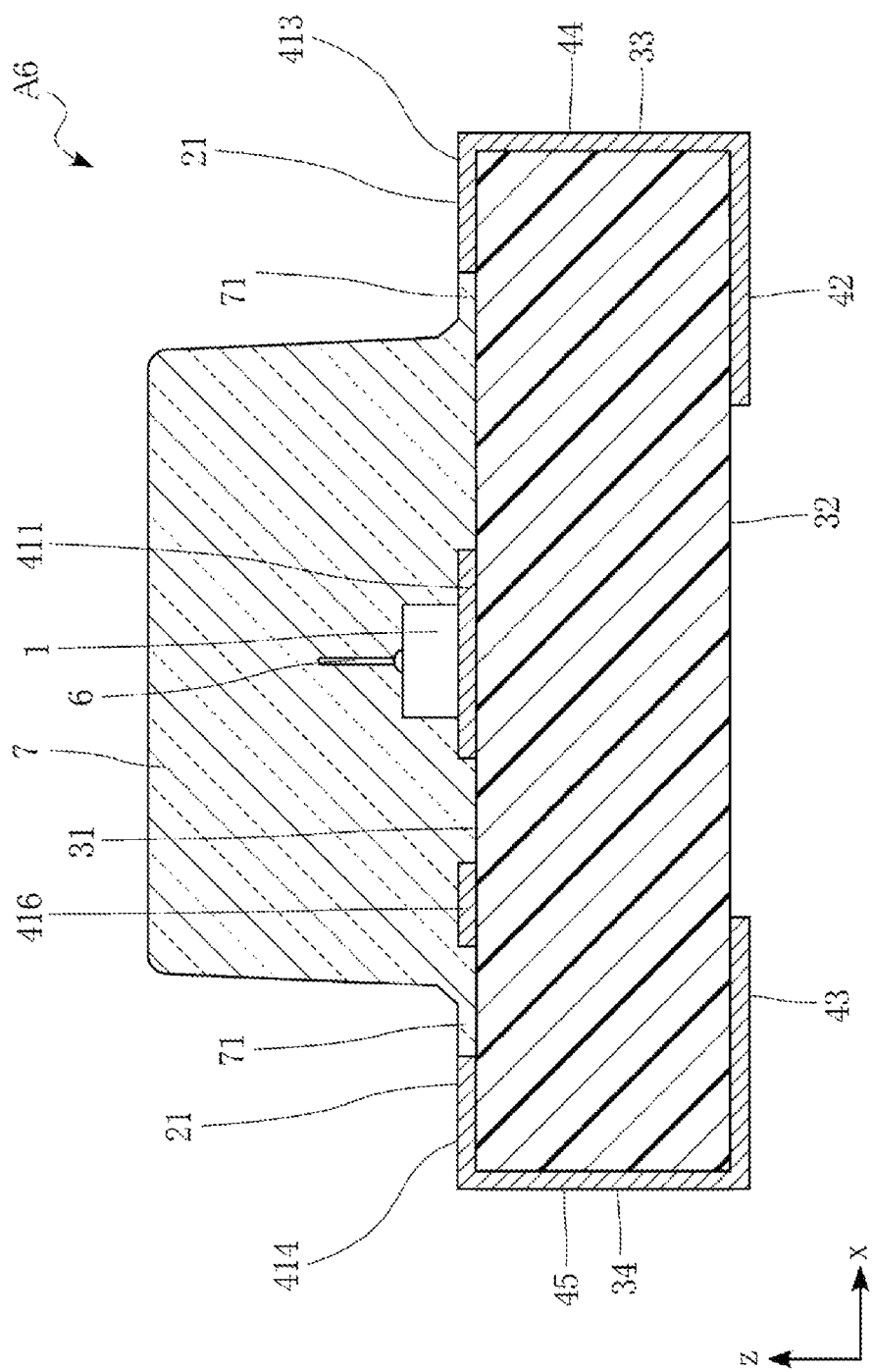

SEMICONDUCTOR LIGHT EMITTING DEVICE AND METHOD OF MANUFACTURING THE SAME

CROSS-REFERENCE TO RELATED APPLICATION

This application is based upon and claims the benefit of priority from Japanese Patent Application No. 2017-027881, filed on Feb. 17, 2017, the entire contents of which are incorporated herein by reference.

TECHNICAL FIELD

The present disclosure relates to a semiconductor light emitting device including a semiconductor light emitting element, and a method of manufacturing the same.

BACKGROUND

In the related art, an example of a conventional semiconductor light emitting device is disclosed. The semiconductor light emitting device includes a base, a semiconductor light emitting element, a wiring pattern, a resist layer and a sealing resin. In the semiconductor light emitting device, the wiring pattern and the resist layer are formed on the base. The resist layer has a portion (pattern covering portion) formed on the wiring pattern and a portion (base covering portion) formed on the base. The semiconductor light emitting element is mounted on the base. The sealing resin is formed on the base so as to cover the semiconductor light emitting element. The sealing resin is typically formed by molding which is a method for forming the sealing resin. In the semiconductor light emitting device, the base is sandwiched between a pair of upper and lower molds, and a resin material such as epoxy resin or the like is injected into and filled in a cavity formed between the base and the molds. Then, the filled resin material is cured to form the sealing resin.

The conventional semiconductor light emitting device has a portion where the base is exposed (a portion where neither the wiring pattern nor the resist layer is formed), the base covering portion, the pattern covering portion and the like, thereby causing a step in a thickness direction. Due to the step, when the base is sandwiched between the molds, a gap may be produced between the molds and the base. As a result, the resin material injected into the cavity may leak through the gap to an unintended place. If the sealing resin formed by such resin leakage covers a terminal portion for connection to an external circuit, a conduction path to the external circuit cannot be secured. In addition, the resin leakage may cause resin burrs, which requires a resin burr removing process.

SUMMARY

Some embodiments of the present disclosure provide a semiconductor light emitting device and a method of manufacturing the semiconductor light emitting device, which are capable of suppressing resin leakage.

According to an embodiment of the present disclosure, there is provided a semiconductor light emitting device including: a semiconductor light emitting element; a sealing resin covering the semiconductor light emitting element; and a support member including a base and configured to support the semiconductor light emitting element and the sealing resin, the base including a base main surface facing one side of a first direction which is a thickness direction, a base back surface facing the other side of the first direction, a pair of first base side surfaces opposite to each other in a second direction orthogonal to the first direction, and a pair of second base side surfaces opposite to each other in a third direction orthogonal to the first direction and the second direction. The support member includes a flat raised plane which is a flat surface raised from the base main surface in the first direction, and the plane is exposed from the sealing resin and includes a portion extending from one edge to the other edge in the third direction when viewed in the first direction.

In some embodiments, the raised plane may be entirely exposed from the sealing resin.

In some embodiments, the raised plane may be in contact with an edge of the sealing resin in the second direction when viewed in the first direction.

In some embodiments, the sealing resin may include a protruding portion protruding in the second direction, and a surface of the protruding portion facing in the same direction as a direction in which the base main surface faces may be at the same position as a position of the raised plane in the first direction.

In some embodiments, the raised plane may be located at the most front side in a direction where the base main surface faces, in a portion of the support member exposed from the sealing resin.

In some embodiments, the support member may further include a wiring pattern formed on the base.

In some embodiments, the wiring pattern may include a main surface electrode formed on the base main surface.

In some embodiments, the raised plane may be a portion of the main surface electrode.

In some embodiments, the support member may further include a resist layer made of an insulating material.

In some embodiments, the resist layer may include a base covering portion formed on the base main surface, and the raised plane may be a part of the base covering portion.

In some embodiments, the resist layer may include a pattern covering portion formed on the main surface electrode, and the raised plane may be a part of the pattern covering portion.

In some embodiments, the wiring pattern may include a pair of back surface electrodes formed on the base back surface and separated from each other.

In some embodiments, the semiconductor light emitting device may further include a wire connecting the semiconductor light emitting element and the wiring pattern.

In some embodiments, the main surface electrode may include a die bonding portion to which the semiconductor light emitting element is die-bonded and a wire bonding portion which is electrically conducted with the semiconductor light emitting element via the wire.

In some embodiments, the wiring pattern may include a pair of side surface electrodes formed on the first base side surfaces and connecting the main surface electrode and the back surface electrodes.

In some embodiments, the first base side surface may include a through-hole recessed in the second direction and penetrating from the base main surface to the base back surface, and the wiring pattern may include a pair of side surface electrodes formed on a surface of the through-hole.

In some embodiments, the main surface electrode may include a pair of edge portions connected to the side surface electrode in the first direction, and a pair of connecting portions, one connecting portion connecting the die bonding portion and one of the edge portions and the other connecting portion connecting the wire bonding portion and the other of the edge portions.

In some embodiments, the main surface electrode may be connected to the connecting portions and further include a pair of extending portions extending from one edge of the base main surface to the other edge of the base main surface in the third direction when viewed in the first direction.

In some embodiments, the raised plane may be a part of the pattern covering portion formed on the extending portions.

In some embodiments, the resist layer may include an annular portion surrounding a periphery of the die bonding portion when viewed in the first direction.

According to another embodiment of the present disclosure, there is provided a method of manufacturing the semiconductor light emitting device. The method includes: forming the support member including the raised plane; bonding the semiconductor light emitting element to the support member; and molding the sealing resin by inserting the support member in a pair of molds in the first direction and injecting a resin material into a cavity inside the molds, wherein, before the act of molding the sealing resin, in consideration of a mold pressing region on which the molds abut, the act of forming the support member is performed such that the raised plane extends continuously from one edge to the other edge of the mold pressing region in the third direction.

In some embodiments, the act of forming the support member includes: providing the base; forming a wiring pattern on the base; and forming a resist layer, wherein the act of forming the resist layer includes forming the resist layer by crimping, adhering and curing a film-shaped resist.

BRIEF DESCRIPTION OF DRAWINGS

FIG. 21 is a plan view of a semiconductor light emitting device according to a sixth embodiment of the present disclosure.

FIG. 22 is a cross-sectional view taken along line XXII-XXII in FIG. 21.

DETAILED DESCRIPTION

Figure 1:
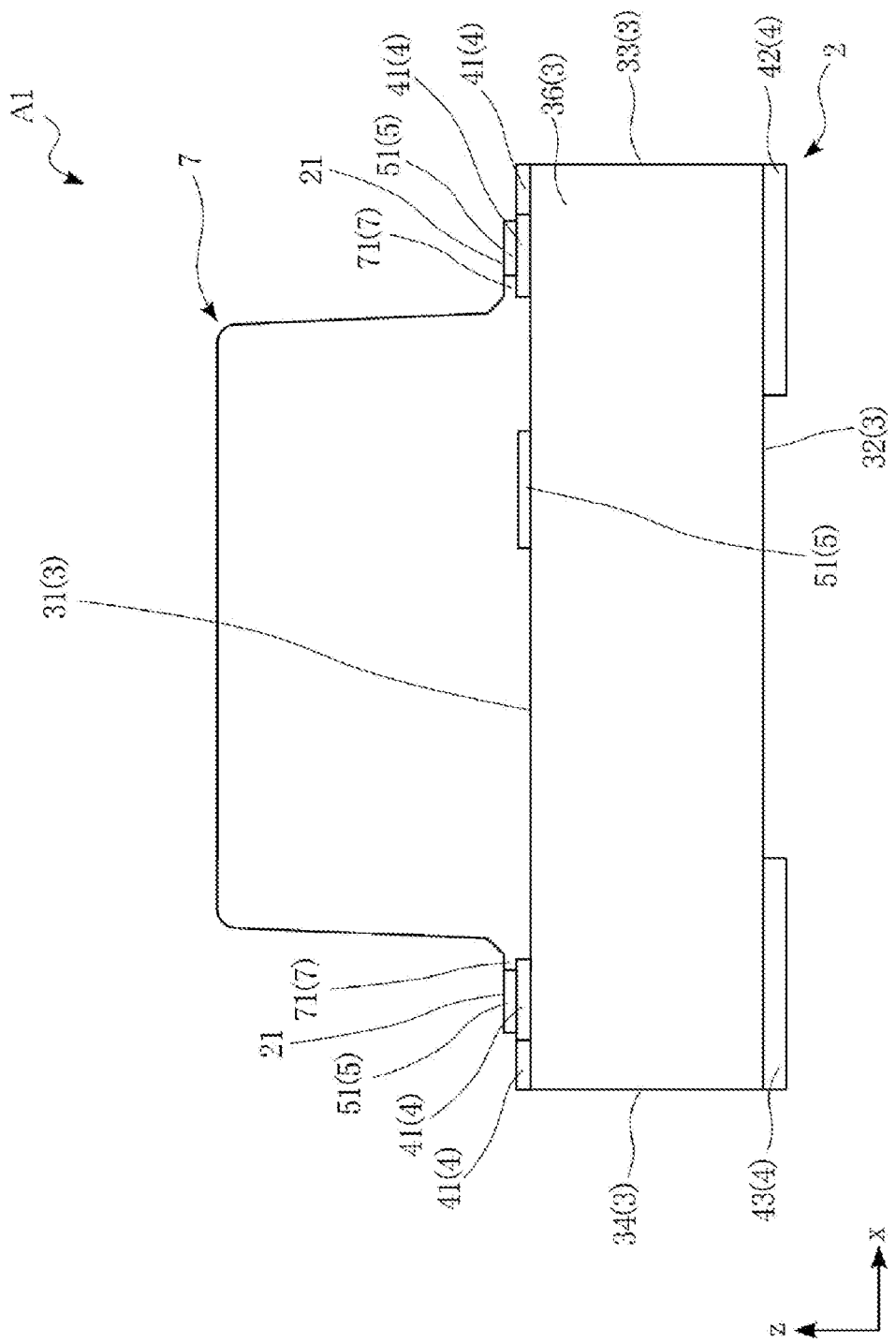
FIG. 1 is a front view of a semiconductor light emitting device according to a first embodiment of the present disclosure.

Exemplary embodiments of the present disclosure will be now described in detail with reference to the drawings.

FIGS. 1 to 7 are views showing a semiconductor light emitting device A1 according to a first embodiment of the present disclosure. The semiconductor light emitting device A1 according to the first embodiment includes a semiconductor light emitting element 1, a support member 2 (including a base 3, a wiring pattern 4 and a resist layer 5), a wire 6 and a sealing resin 7.

Figure 2:
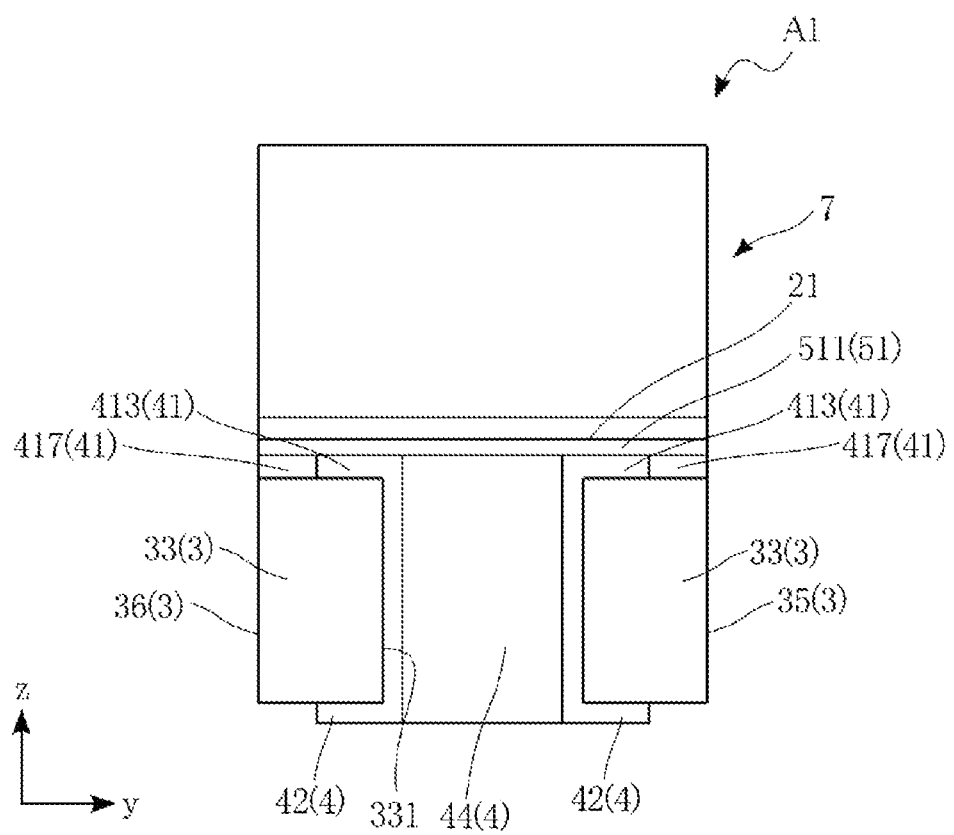
FIG. 2 is a right side view of the semiconductor light emitting device according to the first embodiment of the present disclosure.
Figure 3:
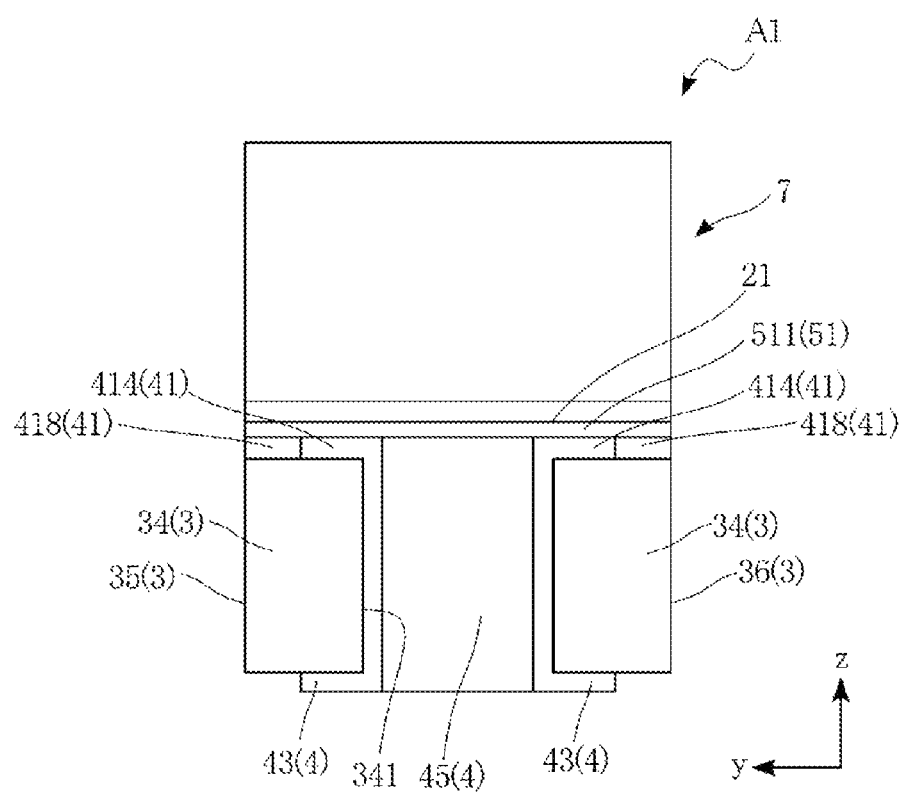
FIG. 3 is a left side view of the semiconductor light emitting device according to the first embodiment of the present disclosure.
Figure 4:
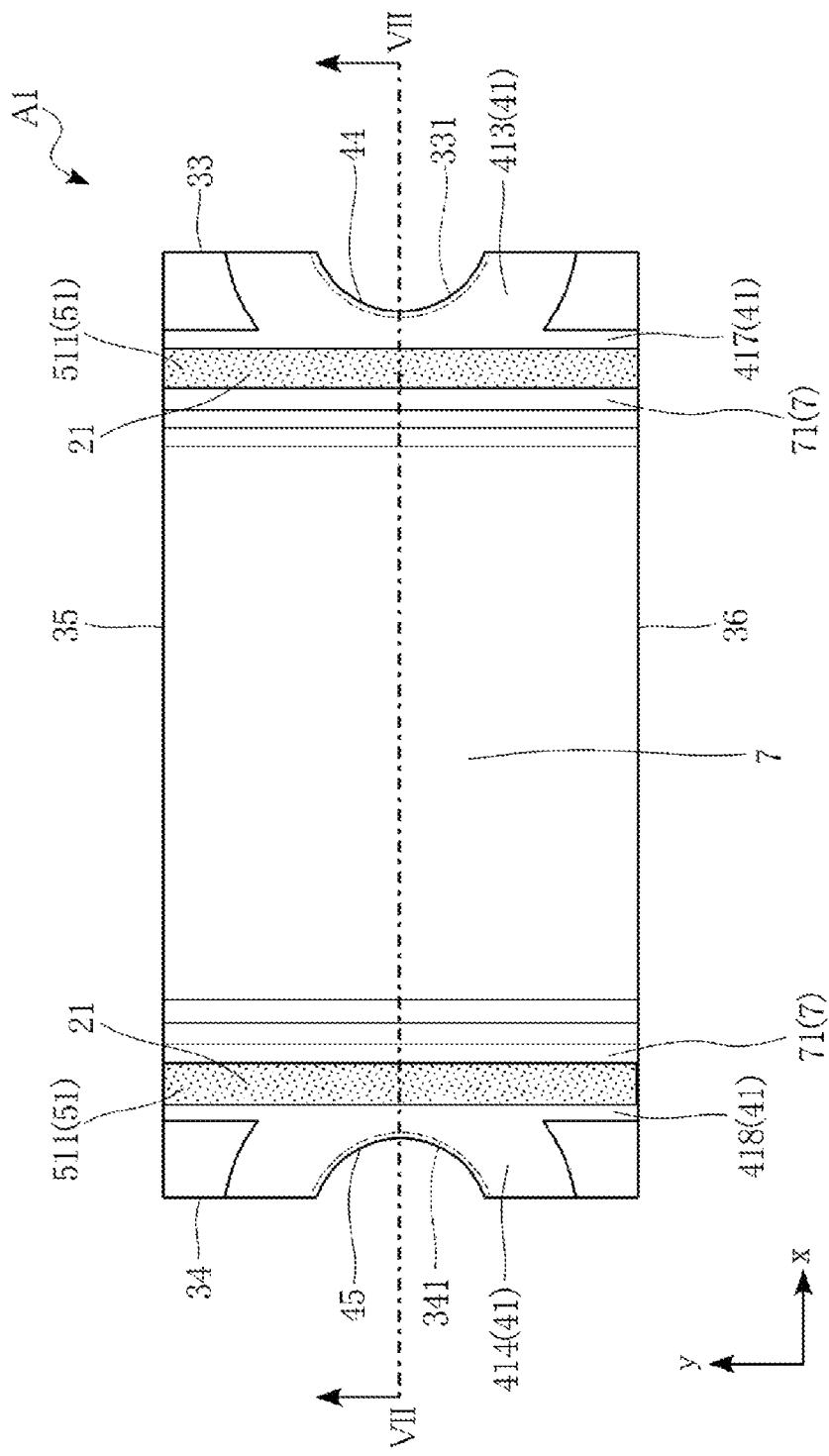
FIG. 4 is a plan view of the semiconductor light emitting device according to the first embodiment of the present disclosure.
Figure 5:
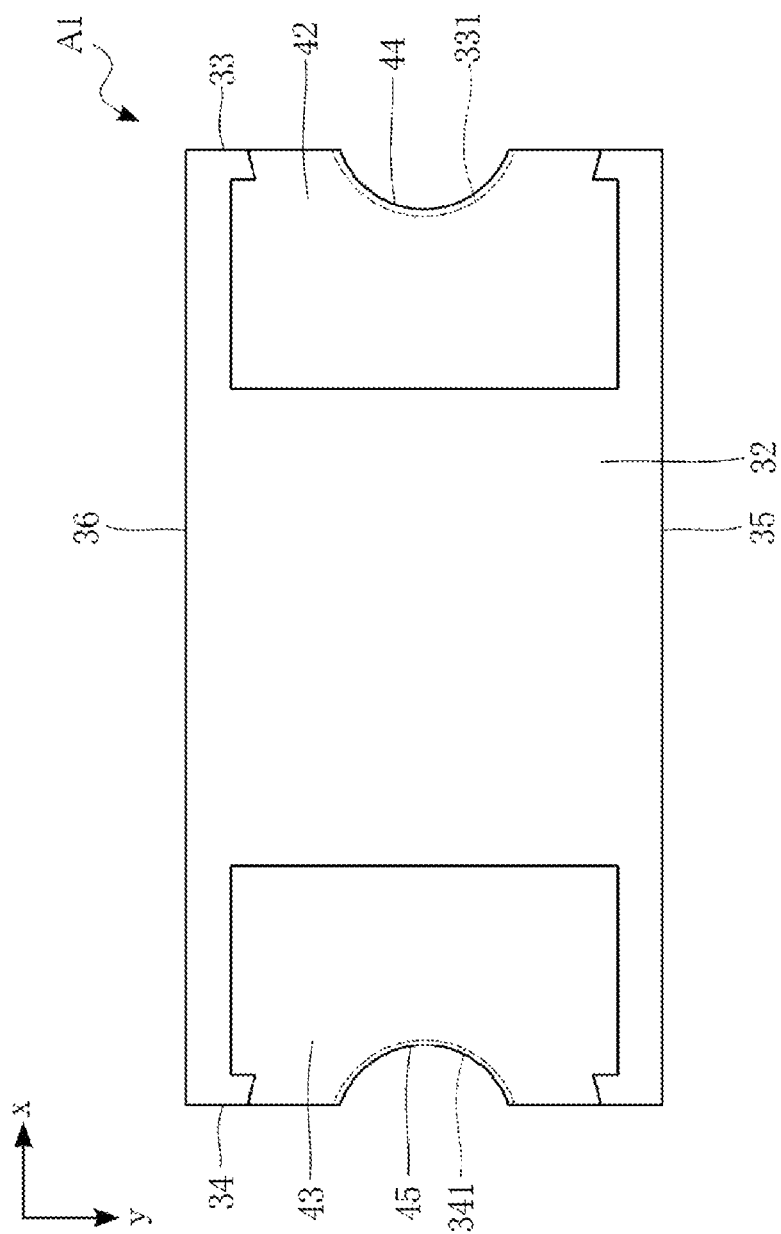
FIG. 5 is a bottom view of the semiconductor light emitting device according to the first embodiment of the present disclosure.
Figure 6:
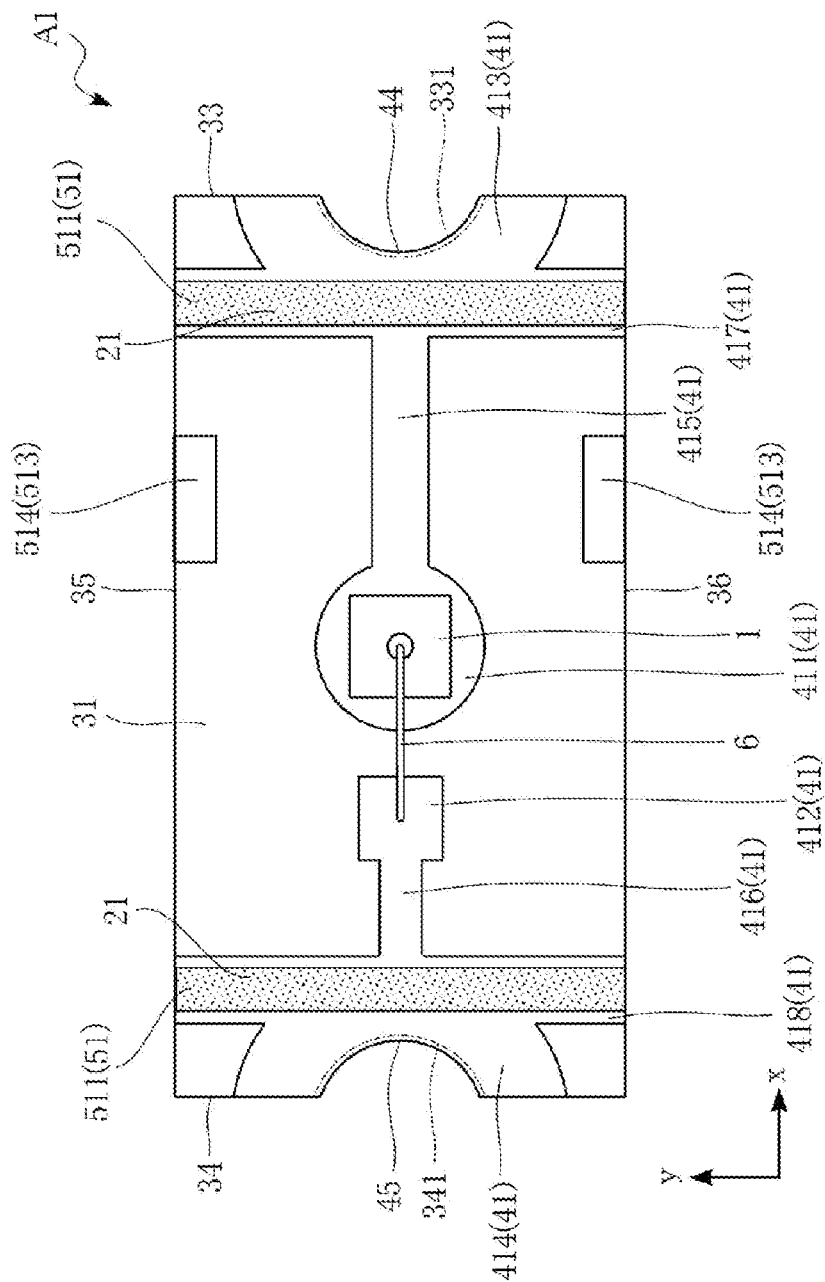
FIG. 6 is a view in which a sealing resin is excluded from the plan view of FIG. 4.
Figure 7:
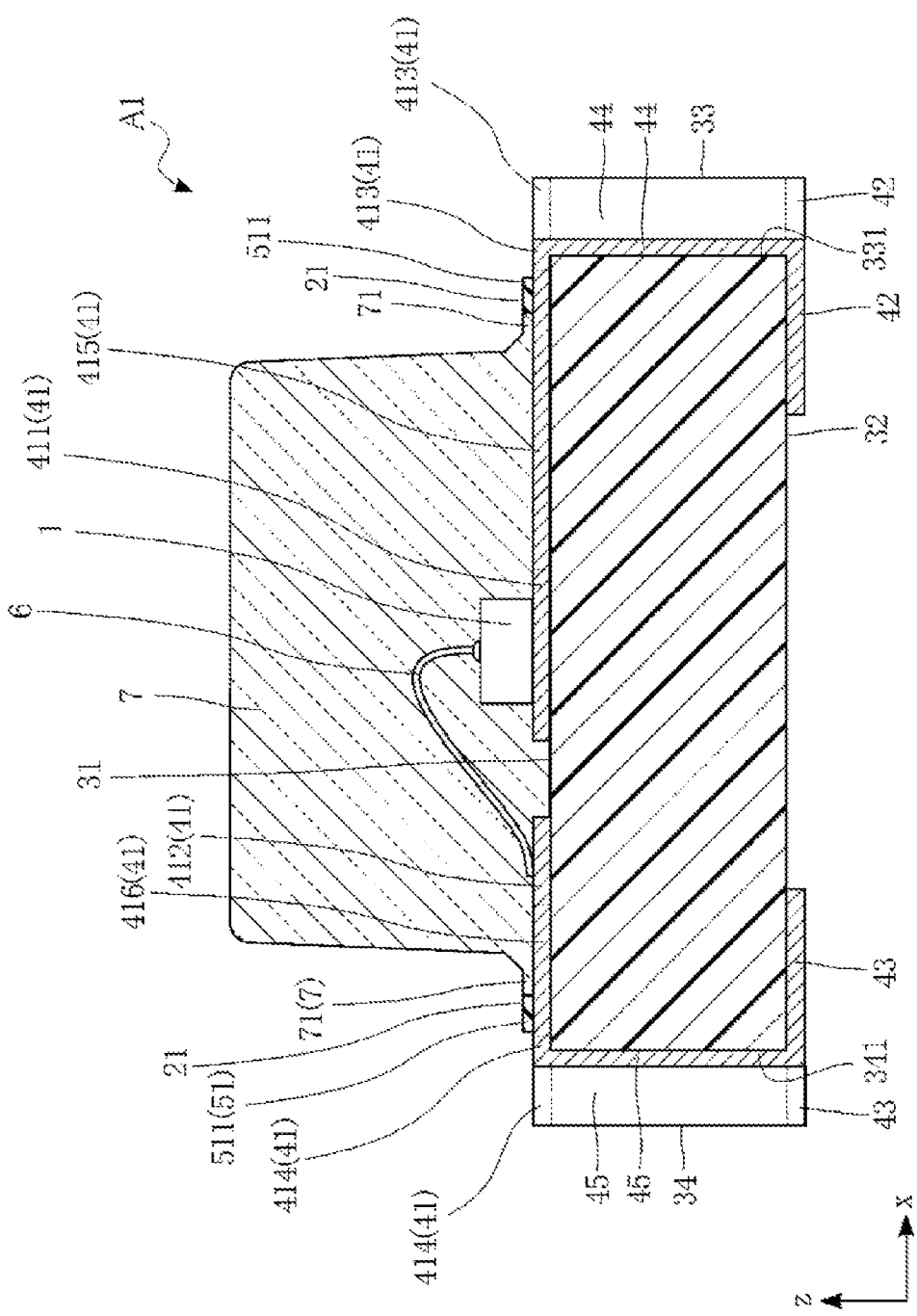
FIG. 7 is a cross-sectional view taken along line in FIG. 4.

FIG. 1 is a front view of the semiconductor light emitting device A1. FIG. 2 is a right side view of the semiconductor light emitting device A1 shown in FIG. 1. FIG. 3 is a left side view of the semiconductor light emitting device A1. FIG. 4 is a plan view of the semiconductor light emitting device A1 shown in FIG. 1. FIG. 5 is a bottom view of the semiconductor light emitting device A1 shown in FIG. 1. FIG. 6 is a view in which the sealing resin 7 is excluded from the plan view of FIG. 4. FIG. 7 is a cross-sectional view taken along line VII-VII of FIG. 4.

In FIGS. 1 to 7, the lengthwise direction of the semiconductor light emitting device A1 is denoted by x, the widthwise direction thereof is denoted by y, and the thickness direction thereof is denoted by z. The lengthwise direction x, the widthwise direction y and the thickness direction z are orthogonal to each other. In these directions, a direction to which an arrow points is a forward direction, and the opposite direction is a backward direction. Therefore, FIG. 2 is a side view of the semiconductor light emitting device A1 when viewed from the front side in the thickness direction x, and FIG. 3 is a side view of the semiconductor light emitting device A1 when viewed from the rear side in the thickness direction z. The thickness direction z corresponds to a "first direction" recited in the present disclosure, the lengthwise direction x corresponds to a "second direction" recited in the present disclosure, and the widthwise direction y corresponds to a "third direction" recited in the present disclosure.

The semiconductor light emitting element 1 is an electronic component serving as a light source of the semiconductor light emitting device A1. In the first embodiment, the semiconductor light emitting element 1 is a so-called LED chip. Note that the present disclosure is not limited to the LED chip but may be applied to a light receiving element, a diode or the like. The semiconductor light emitting element 1 includes an n-type semiconductor layer, an active layer and a p-type semiconductor layer. The n-type semiconductor layer is laminated on the active layer. The active layer is laminated on the p-type semiconductor layer. That is, the active layer is located between the n-type semiconductor layer and the p-type semiconductor layer. The n-type semiconductor layer, the active layer and the p-type semiconductor layer are made of, for example, GaN. Although not shown, the semiconductor light emitting element 1 has a main surface electrode pad on a surface facing the front in the thickness direction z and a back surface electrode pad on a surface facing the rear in the thickness direction z. The semiconductor light emitting element 1 is mounted on the support member 2. The emission color of the semiconductor light emitting element 1 is not particularly limited.

The support member 2 supports the semiconductor light emitting element 1 and the sealing resin 7. In the first embodiment, the support member 2 includes a base 3, a wiring pattern 4 and a resist layer 5. Further, in the first embodiment, the support member 2 has a raised plane 21.

The raised plane 21 is a portion that is raised forward in the thickness direction z among surfaces facing the front in the thickness direction z of the support member 2. Specifically, the raised plane 21 is the most raised portion in the front of a base main surface 31 of the base 3, which will be described later, in the thickness direction z. The raised plane 21 is planar and, in the first embodiment, is parallel to a plane (x-y plane) orthogonal to the thickness direction z. Further, the raised plane 21 is exposed from the sealing resin 7. As shown in FIG. 4, the raised plane 21 extends from one edge to the other edge of the support member 2 in the widthwise direction y, when viewed in the thickness direction z. The raised plane 21 is a surface that is brought into contact with a mold 91 used in a step of molding the sealing resin 7 (this step will be described later). For convenience of understanding, hatching is given to a portion corresponding to the raised plane 21 in some figures (FIG. 4, FIG. 6, etc.).

The base 3 is a part serving as a base of the support member 2 and is made of an insulating material, for example, insulating resin such as glass epoxy resin or the like, ceramic such as $Al_2O_3$, SiC, AlN or the like, etc. The base 3 may be a substrate made of metal such as aluminum with an insulating film formed thereon. The base 3 has a rectangular shape extending long in the lengthwise direction x when viewed in the thickness direction z. The base 3 has a base main surface 31, a base back surface 32, a pair of first base side surfaces 33 and 34 and a pair of second base side surfaces 35 and 36.

As shown in FIGS. 1 and 7, the base main surface 31 and the base back surface 32 are spaced apart from each other in the thickness direction z and face opposite sides. The base main surface 31 is a surface facing forward in the thickness direction z. The base back surface 32 is a surface facing backward in the thickness direction z. Both of the base main surface 31 and the base back surface 32 are flat.

As shown in FIGS. 1, 4, 5 and 6, the first base side surfaces 33 and 34 in pair are spaced apart from each other in the lengthwise direction x and face opposite sides. The first base side surface 33 is a surface facing forward in the lengthwise direction x and the first base side surface 34 is a surface facing backward in the lengthwise direction x. Both of the first base side surfaces 33 and 34 are connected to the base main surface 31 at their front end portions in the thickness direction z and are connected to the base back surface 32 at their rear end portions in the thickness direction z. Both of the first base side surfaces 33 and 34 are flat. The first base side surfaces 33 and 34 have through-hole portions 331 and 341, respectively.

The through-hole portions 331 and 341 are portions recessed into the base 3 from the first base side surfaces 33 and 34, respectively. Both of the through-hole portions 331 and 341 penetrate from the base main surface 31 toward the base back surface 32. In the first embodiment, the through-hole portions 331 and 341 are semicircular when viewed in the thickness direction z.

As shown in FIGS. 2 to 6, the second base side surfaces 35 and 36 in pair are spaced apart from each other in the widthwise direction y and face opposite sides. The second base side surface 35 is a surface facing forward in the widthwise direction y and the second base side surface 36 is a surface facing backward in the widthwise direction y. Both of the second base side surfaces 35 and 36 are connected to the base main surface 31 at their front end portions in the thickness direction z and are connected to the base back surface 32 at their rear end portions in the thickness direction z. Both of the second base side surfaces 35 and 36 are flat.

The wiring pattern 4 constitutes a current path for supplying power to the semiconductor light emitting element 1. The wiring pattern 4 makes electrical conduction with the semiconductor light emitting element 1. The wiring pattern 4 is made of, for example, metals such as Cu, Ni, Ti, Au and the like, alone or in combination. The wiring pattern 4 is formed on the base 3. In the first embodiment, the wiring pattern 4 is formed by plating Au on a Cu foil. The material of the wiring pattern 4 is not particularly limited. The wiring pattern 4 includes a main surface electrode 41, back surface electrodes 42 and 43 and side surface electrodes 44 and 45.

The main surface electrode 41 covers a portion of the base main surface 31 of the base 3. The main surface electrode 41 includes a die bonding portion 411, a wire bonding portion 412, a first edge portion 413, a second edge portion 414, a first connecting portion 415, a second connecting portion 416, a first extending portion 417 and a second extending portion 418.

The die bonding portion 411 is a portion that supports the semiconductor light emitting element 1. The die bonding portion 411 is bonded with the semiconductor light emitting element 1 by means of a conductive bonding material (not shown) such as solder. Ag paste or the like such that the die bonding portion 411 and the back surface electrode pad of the semiconductor light emitting element 1 face each other. In the first embodiment, the die bonding portion 411 has a circular shape when viewed in the thickness direction z. The die bonding portion 411 is not limited to a circular shape but may have other shapes such as a rectangular shape, a polygonal shape and the like.

The wire bonding portion 412 is a portion for bonding the wire 6. In the first embodiment, the wire bonding portion 412 has a rectangular shape when viewed in the thickness direction z. The shape of the wire bonding portion 412 is not limited thereto.

The first edge portion 413 covers the vicinity of a portion of the base main surface 31 connected to the through-hole portion 331. The second edge portion 414 covers the vicinity of a portion of the base main surface 31 connected to the through-hole portion 341. In the first embodiment, both of the first edge portion 413 and the second edge portion 414 have a semi-annular shape when viewed in the thickness direction z.

The first connecting portion 415 connects the die bonding portion 411 and the first edge portion 413. The second connecting portion 416 connects the wire bonding portion 412 and the second edge portion 414. In the first embodiment, both of the first connecting portion 415 and the second connecting portion 416 have a strip shape extending linearly in the lengthwise direction x. Further, in the first embodiment, the first connecting portion 415 and the second connecting portion 416 are positioned near the center in the widthwise direction y. The shapes of the first connecting portion 415 and the second connecting portion 416 are not limited thereto.

The first extending portion 417 is a portion extending in the widthwise direction y from the first connecting portion 415. The second extending portion 418 is a portion extending in the widthwise direction y from the second connecting portion 416. The first extending portion 417 and the second extending portion 418 extend from the front edge to the rear edge of the base main surface 31 in the widthwise direction y. The first extending portion 417 is disposed on the front side of the base main surface 31 in the lengthwise direction x. The second extending portion 418 is disposed on the rear side of the base main surface 31 in the lengthwise direction x. In the first embodiment, the first extending portion 417 is connected to the first edge portion 413 and the first connecting portion 415. The second extending portion 418 is connected to the second edge portion 414 and the second connecting portion 416. Both of the first extending portion 417 and the second extending portion 418 have a flat surface facing the front in the thickness direction z.

The back surface electrodes 42 and 43 cover a portion of the base back surface 32. The back surface electrodes 42 and 43 are used as bonding sites for mounting the semiconductor light emitting device A1 on a mounting board or the like. The back surface electrodes 42 and 43 are separated and insulated from each other in the lengthwise direction x. The back surface electrode 42 is disposed on the front side in the lengthwise direction x and the back surface electrode 43 is disposed on the rear side in the lengthwise direction x.

The side surface electrodes 44 and 45 cover the surfaces of the through-hole portions 331 and 341 of the base 3, respectively. The side surface electrodes 44 and 45 reach the base back surface 32 from the base main surface 31. An edge of the side surface electrode 44 in the front in the thickness direction z is connected to the first edge portion 413 and an edge thereof in the rear in the thickness direction z is connected to the back surface electrode 42. Therefore, the back surface electrode pad of the semiconductor light emitting element 1 is electrically connected to the back surface electrode 42 via the die bonding portion 411, the first connecting portion 415, the first edge portion 413 and the side surface electrode 44. An edge of the side surface electrode 45 in the front in the thickness direction z is connected to the second edge portion 414 and an edge thereof in the rear in the thickness direction z is connected to the back surface electrode 43.

The resist layer 5 is made of an insulating material. The resist layer 5 includes a base main surface side resist 51.

The base main surface side resist 51 is formed in the base main surface 31 side of the base 3. The base main surface side resist 51 is formed on the base main surface 31 by crimping, adhering and curing a film-shaped resist. Due to a pressure at the time of crimping the film-shaped resist, the surface of the base main surface side resist 51 in the front in the thickness direction z is flat. The base main surface side resist 51 includes a pattern covering portion 511 and a base covering portion 513.

The pattern covering portion 511 is a portion of the base main surface side resist 51 formed on the wiring pattern 4. The surface of the pattern covering portion 511 in the front in the thickness direction z is flat. In the first embodiment, as shown in FIG. 6, the pattern covering portion 511 covers a portion of the first extending portion 417 and a portion of the second extending portion 418 and extends from the second base side surface 35 to the second base side surface 36 in the widthwise direction y, when viewed from the thickness direction z. In addition, as shown in FIG. 7, the pattern covering portion 511 is located outside the sealing resin 7 in the lengthwise direction x and is exposed from the sealing resin 7. Further, as shown in FIGS. 6 and 7, the pattern covering portion 511 is in contact with the edge of the sealing resin 7 in the lengthwise direction x. The pattern covering portion 511 is located at the most front side in the thickness direction z of the support member 2 and protrudes forward in the thickness direction z from the base main surface 31. Therefore, in the first embodiment, the surface of the pattern covering portion 511 facing the front in the thickness direction z is located at the most front side in the thickness direction z of the support member 2 (including the base 3, the wiring pattern 4 and the resist layer 5) and corresponds to the raised plane 21.

The base covering portion 513 is a portion of the base main surface side resist 51 formed on the base 3. The surface of the base covering portion 513 facing the front in the thickness direction z is flat. The base covering portion 513 includes a polarity determination mark portion 514.

The polarity determination mark portion 514 functions as a marker for determining the polarity of the semiconductor light emitting device A1. Specifically, the polarity determination mark portion 514 indicates whether an edge of the semiconductor light emitting device A1 in the lengthwise direction x is a positive electrode terminal or a negative electrode terminal. When mounting the semiconductor light emitting device A1 on a mounting board or the like, a user determines which of the back surface electrodes 42 and 43 is to be connected to the positive electrode side or the negative electrode side, based on the polarity determination mark portion 514. In the first embodiment, the polarity determination mark portion 514 is formed on the front side of the base 3 in the lengthwise direction x from the center position thereof in the lengthwise direction x, and is formed on both edges of the base 3 in the widthwise direction y. In the first embodiment, the base covering portion 513 and the polarity determination mark portion 514 coincide with each other.

The wire 6 is used to make electrical conduction between the semiconductor light emitting element 1 and the wiring pattern 4. The wire 6 is made of conductive metal such as Au, Al, Cu or the like and is bonded by wire bonding. The wire 6 has one end bonded to the main surface electrode pad of the semiconductor light emitting element 1 and the other end bonded to the wire bonding portion 412. Therefore, the main surface electrode pad of the semiconductor light emitting element 1 is electrically connected to the back surface electrode 43 via the wire 6, the wire bonding portion 412, the second connecting portion 416, the second edge portion 414 and the side surface electrode 45.

The sealing resin 7 covers the semiconductor light emitting element 1, a portion of the wiring pattern 4, a portion of the resist layer 5, and the wire 6. The sealing resin 7 is made of a resin material that transmits light, such as transparent or translucent epoxy resin, silicone resin, acrylic resin, polyvinyl type resin or the like. Further, the sealing resin 7 may contain a fluorescent material which emits light of different wavelengths when excited by light from the semiconductor light emitting element 1.

The sealing resin 7 is formed by molding in a molding step. The sealing resin 7 is smaller in the lengthwise direction x than the support member 2. In the first embodiment, the sealing resin 7 has a truncated quadrangular pyramidal shape and a surface thereof facing the front in the thickness direction z is smaller than a surface thereof facing the rear in the thickness direction z. The sealing resin 7 may have a semispherical shape protruding forward in the thickness direction z, instead of the truncated quadrangular pyramidal shape, or may have a concave surface in the front in the thickness direction z. Further, in the first embodiment, the sealing resin 7 has a protruding portion 71.

The protruding portion 71 is a portion protruding in the lengthwise direction x from the edge portion of the sealing resin 7 in the rear side in the thickness direction z. The surface of the protruding portion 71 facing the front in the thickness direction z is flat. As shown in FIGS. 1 and 7, the edge of the protruding portion 71 in the lengthwise direction x is in contact with the pattern covering portion 511 (the raised plane 21). The surface of the protruding portion 71 facing the front in the thickness direction z has the same position as the raised plane 21 in the thickness direction z.

Next, a method of manufacturing the semiconductor light emitting device A1 according to the first embodiment will be described with reference to FIGS. 8 to 14. In the first embodiment, a case of manufacturing a plurality of semiconductor light emitting devices A1 will be described as an example. The method of manufacturing the semiconductor light emitting device A1 according to the present disclosure includes a base preparing step, a pattern forming step, a resist forming step, a die bonding step, a wire bonding step and a molding step. A combination of the base preparing step, the pattern formation step and the resist formation step corresponds to a "support member forming step" recited in the present disclosure.

Figure 8:
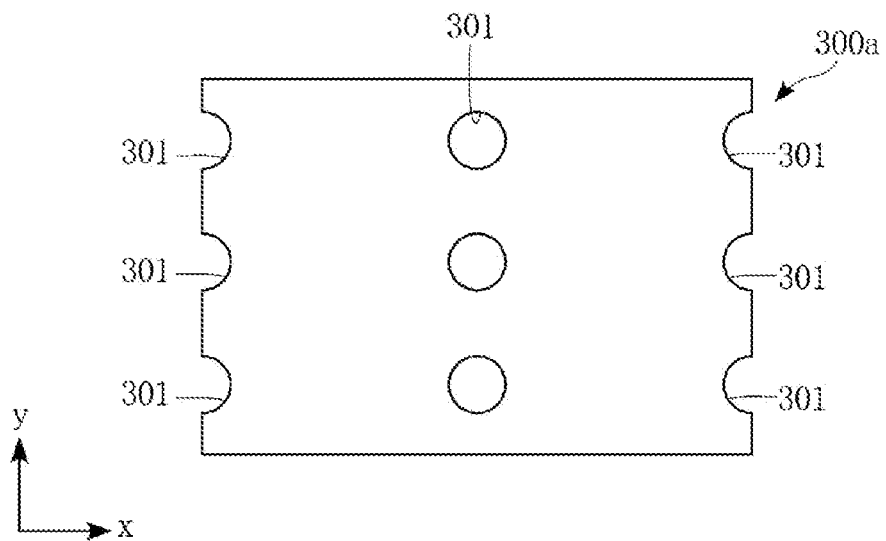
FIG. 8 is a view showing an aggregate base after a base preparing step in a manufacturing method of the present disclosure.
Figure 9:
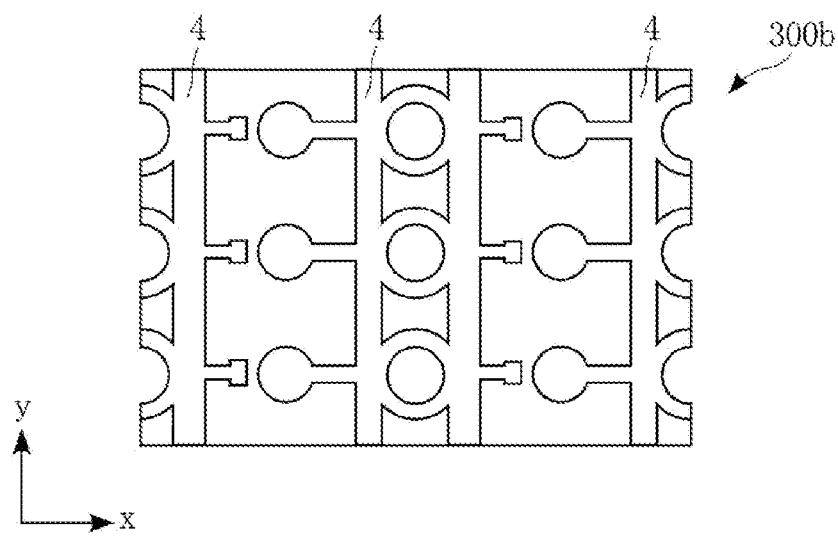
FIG. 9 is a view showing an aggregate base after a pattern forming step in the manufacturing method of the present disclosure.
Figure 10:
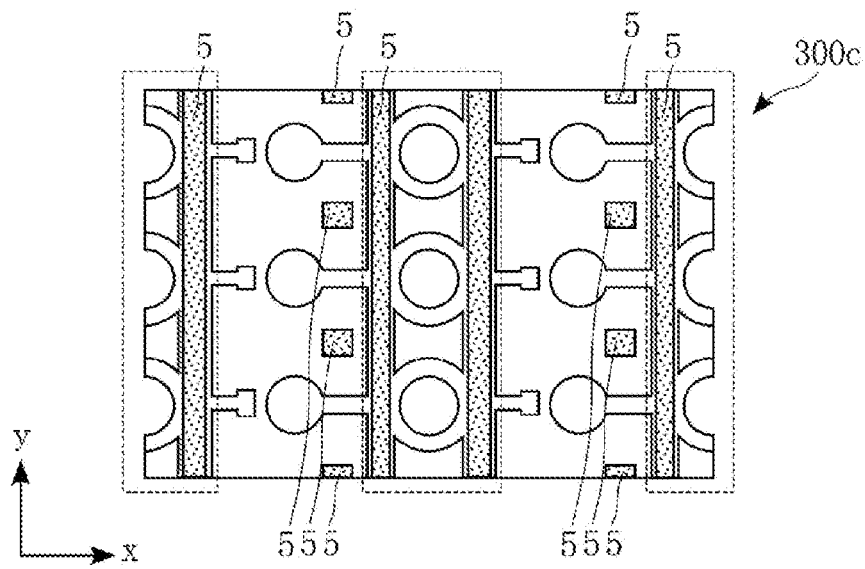
FIG. 10 is a diagram showing an aggregate base after a resist forming step in the manufacturing method of the present disclosure.

In the base preparing step, a rectangular aggregate base 300a (see FIG. 8) having a plurality of through-holes 301 formed in a matrix is prepared. The aggregate base 300a has a size in which a plurality of bases 3 shown in FIGS. 1 to 7 can be formed. In FIG. 8, the size is such that six bases 3 can be formed and six semicircular through-holes 301 and three circular through-holes 301 can be formed in the aggregate base 300a. The plurality of through-holes 301 are formed by, for example, a punching process. The aggregate base 300a is made of the same glass epoxy resin as the material of the base 3.

In the pattern forming step, the wiring pattern 4 is formed on the aggregate base 300a. The wiring pattern 4 is formed by plating Au on a Cu foil. Through this pattern forming step, an aggregate base 300b (see FIG. 9) having the wiring pattern 4 formed on the aggregate base 300a is formed.

In the resist forming step, the resist layer 5 is formed on the aggregate base 300b having the wiring pattern 4 formed thereon. In the first embodiment, a film-shaped resist is crimped and adhered to the front surface of the aggregate base 300b in the thickness direction z. Then, the base main surface side resist 51 is formed by curing the adhered film-shaped resist by exposure or the like. In the resist forming step, the surface of the base main surface side resist 51 in the front side in the thickness direction z becomes flat due to a pressure at the time of crimping the film-shaped resist. Further, the pattern covering portion 511 formed on the wiring pattern 4 and the base covering portion 513 formed on the aggregate base 300b (a portion where the wiring pattern 4 is not formed) are formed on the formed base main surface side resist 51.

The formed pattern covering portion 511 is located at the most front side in the thickness direction z of the support member 2 (including the base 3, the wiring pattern 4 and the resist layer 5) and the surface thereof facing forward in the thickness direction z forms the raised plane 21. The resist forming step is carried out in consideration of a position at which the resist layer 5 is to be formed within a region (surrounded by a dotted line in FIG. 10) to be pressed by the mold 91 (which will be described later) in the molding step (which will be described later) such that the raised plane 21 extends from the edge of an aggregate base 300c in the front in the widthwise direction y to the edge thereof in the rear in the widthwise direction y. Through the resist forming step, the aggregate base 300c (see FIG. 10) having the resist layer 5 formed on the aggregate base 300b is formed.

In the die bonding step, the semiconductor light emitting element 1 is mounted on one side (the front side in the thickness direction z) of the aggregate base 300c by a well-known die bonding technique. The die bonding step corresponds to an "element bonding step" recited in the present disclosure. Then, in the wire bonding step, the wire 6 is wire-bonded to the main surface electrode pad of the semiconductor light emitting element 1 and the wire bonding portion 412 by a well-known wire bonding technique. Consequently, electric conduction between the semiconductor light emitting element 1 and the wiring pattern 4 is secured. Through both the die bonding step and wire bonding step, an aggregate base 300d (see FIG. 11) having the semiconductor light emitting element 1 and the wires 6 bonded to the aggregate base 300c is formed.

Figure 11:
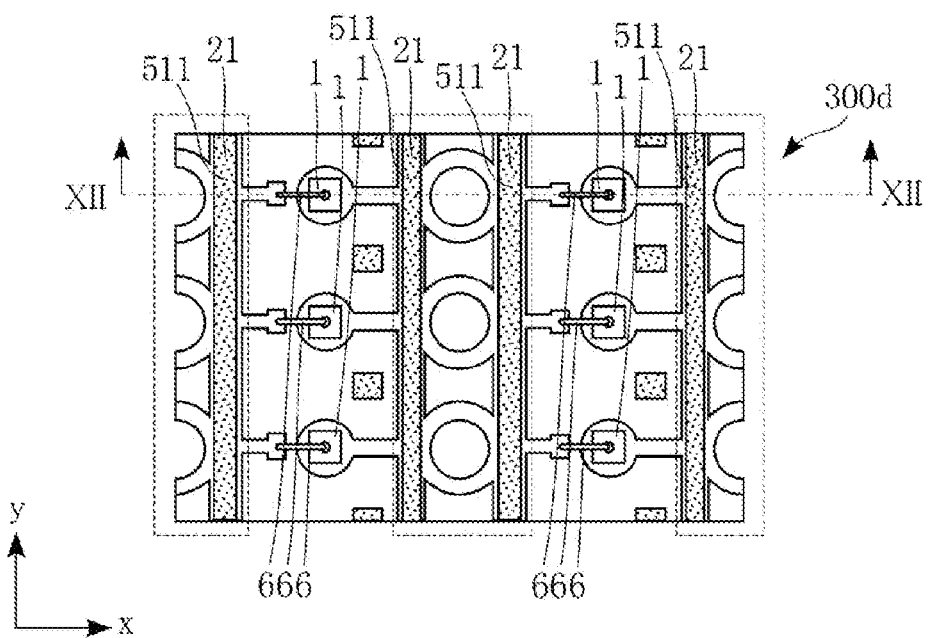
FIG. 11 is a view showing an aggregate base after a die bonding step and a wire bonding step in the manufacturing method of the present disclosure.
Figure 12:
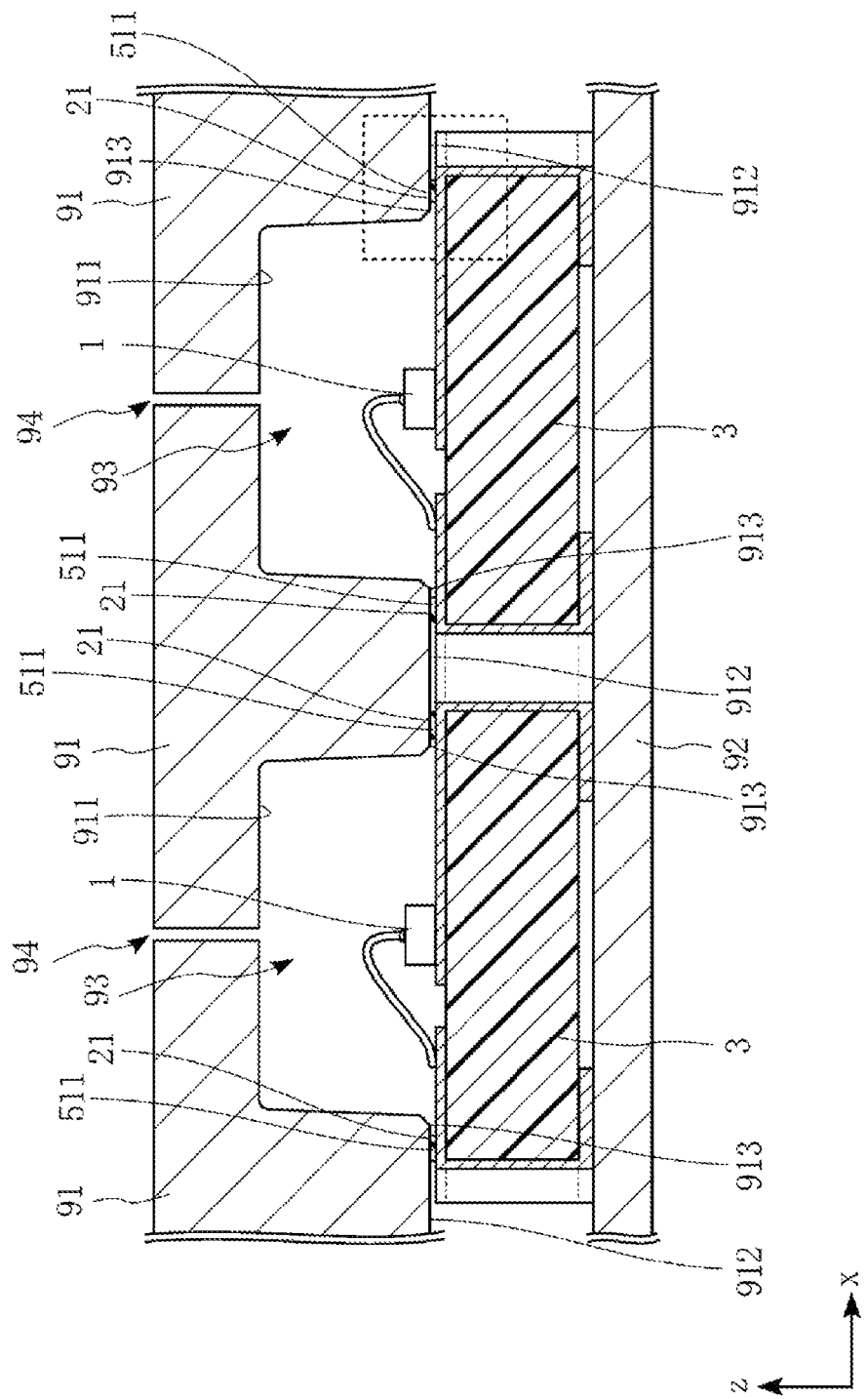
FIG. 12 is a cross-sectional view taken along line XII-XII in FIG. 11.
Figure 13:
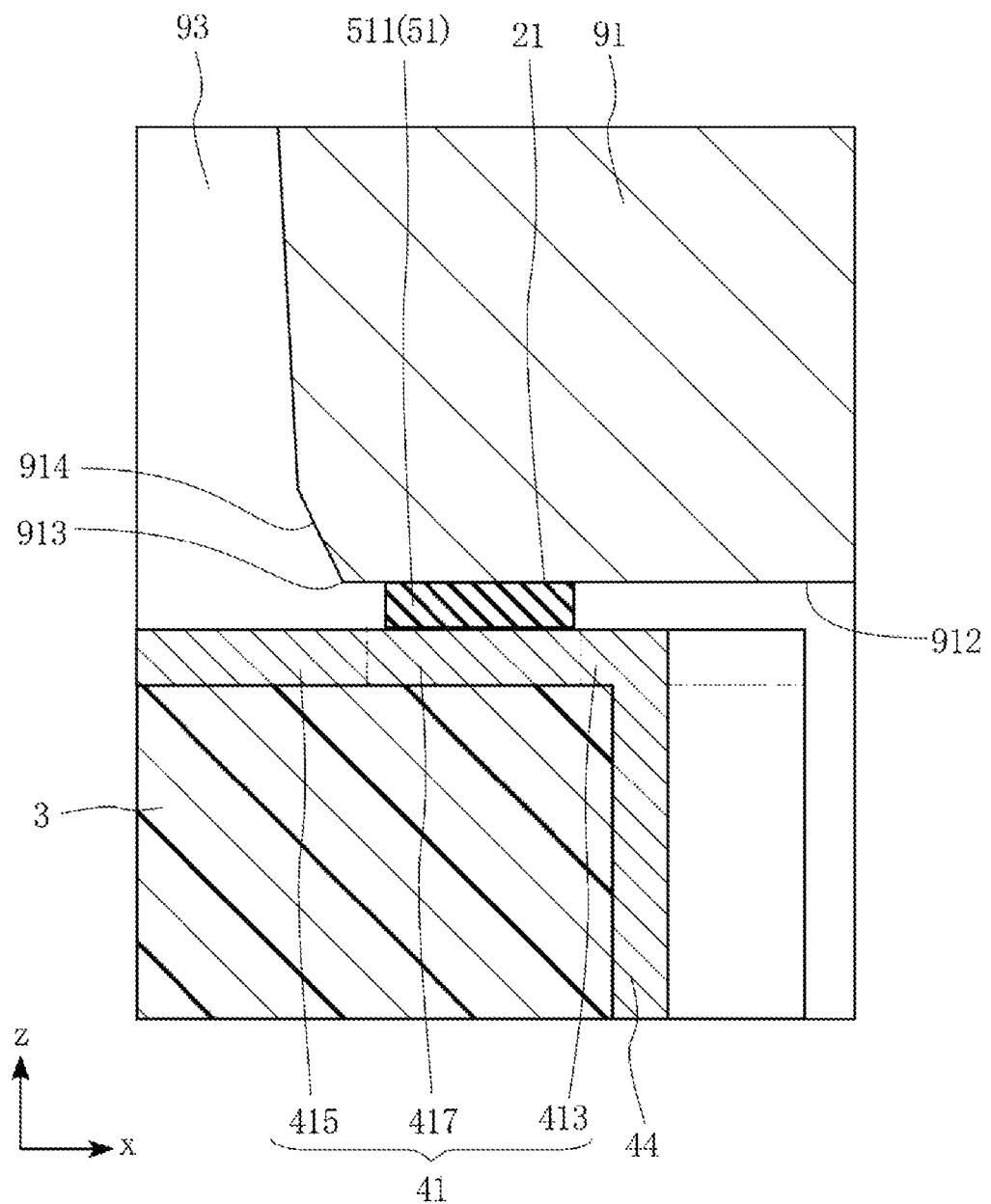
FIG. 13 is an enlarged cross-sectional view showing an enlarged portion of the cross-sectional view of FIG. 12.

In the molding step, the sealing resin 7 is molded on the aggregate base 300d. FIGS. 12 and 13 are views for explaining the molding step. FIG. 12 is a cross-sectional view taken along line XII-XII in FIG. 11 in the molding step and FIG. 13 is a partial enlarged view of a portion indicated by a dotted line in FIG. 12. In the molding step, as shown in FIG. 12, the aggregate base 300d is inserted between molds 91 and 92 in pair in the thickness direction z.

The mold 91 presses the aggregate base 300d from the front side in the thickness direction z. The mold 91 has a concave portion 911, an abutting surface 912, a corner portion 913 and an inclined portion 914. The concave portion 911 is a portion of the mold 91 recessed from the rear side in the thickness direction z into the front side in the thickness direction z. The concave portion 911 has substantially the same dimension and shape as the sealing resin 7. The abutting surface 912 faces backward in the thickness direction z and is located at the most rear side in the most thickness direction z of the mold 91. The abutting surface 912 is flat. The corner portion 913 is a portion that forms a boundary between the concave portion 911 (or the inclined portion 914) and the abutting surface 912. The inclined portion 914 is located on the rear side of the concave portion 911 in the thickness direction z and is inclined so that its section in the x-y plane orthogonal to the thickness direction z becomes larger toward the rear side in the thickness direction z.

The mold 91 configured as described above presses the surface of the aggregate base 300d in the front side in the thickness direction z by the abutting surface 912. In the first embodiment, the mold 91 abuts on the pattern covering portion 511 (the raised plane 21). At this time, even when there are some irregularities on the raised plane 21, the irregularities are absorbed and flattened by being pressed by the mold 91 (the abutting surface 912). In FIG. 11, a region pressed by the abutting surface 912 (a mold pressing region) is surrounded by a thin dotted line.

The mold 92 presses the aggregate base 300d from the rear side in the thickness direction z. The mold 92 has a uniformly flat surface on the front side in the thickness direction z and presses the surface of the aggregate base 300d on the rear side in the thickness direction z. In the first embodiment, the mold 92 abuts on the back surface electrodes 42 and 43.

In the molding step, the aggregate base 300d is inserted between the molds 91 and 92 in pair so as to accommodate the semiconductor light emitting element 1 in the concave portion 911 of the mold 91. As a result, a gap (cavity) 93 is formed by the concave portion 911 and a portion of the aggregate base 300d opposite the concave portion 911. Only the raised plane 21 abuts the surface (abutting surface) 912 of the mold 91 in the rear in the thickness direction z, as shown in FIG. 13, and the raised plane 21 continuously abuts from one edge to the other edge of the aggregate base 300d in the widthwise direction y, as shown in FIG. 11. Then, in a state where the aggregate base 300d is inserted in the mold 91, the cavity 93 is filled with a transparent resin material from a resin injection path 94 formed in the mold 91. Then, this is cured to form the sealing resin 7. The position of the resin injection path 94 is not particularly limited.

As shown in FIG. 13, the corner portion 913 and the raised plane 21 are separated from each other in the lengthwise direction x, and the abutting surface 912 and the wiring pattern 4 (including the first connecting portion 415 and the first extending portion 417) are separated from each other by the thickness of the pattern covering portion 511 in the thickness direction z. The sealing resin 7 flows into a space formed by this separation to form the protruding portion 71. Through the molding step, an aggregate base 300e (see FIG. 14) having the sealing resin 7 formed on the aggregate base 300d is formed.

Figure 14:
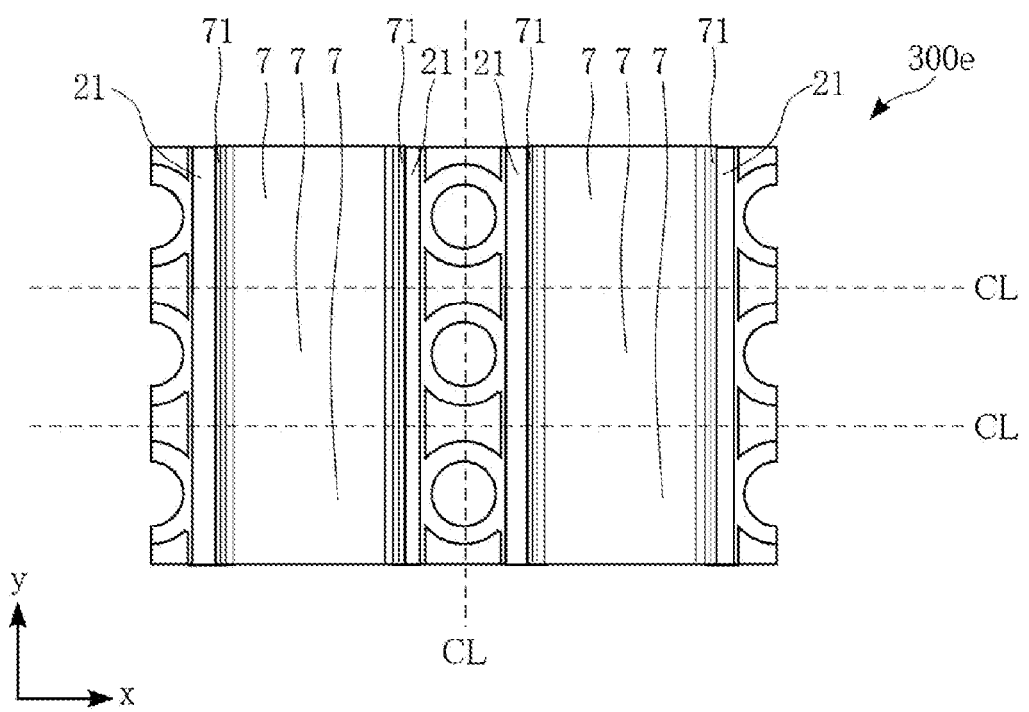
FIG. 14 is a view showing an aggregate base after a molding step in the manufacturing method of the present disclosure.

After forming the sealing resin 7 through the molding step, the aggregate base 300e is cut along a plurality of cutting lines CL shown in FIG. 14. By this cutting, a plurality of semiconductor light emitting devices A1 shown in FIGS. 1 to 7 is manufactured. In the method of manufacturing the semiconductor light emitting device A1, a case of manufacturing a plurality of semiconductor light emitting devices A1 at once has been illustrated above, but they may be manufactured one by one.

Next, the operation of the semiconductor light emitting device A1 according to the first embodiment and the method of manufacturing the same will be described.

According to the first embodiment, the raised plane 21 is located outside the sealing resin 7 in the lengthwise direction x when viewed in the thickness direction z, and extends from the second base side surface 35 to the second base side surface 36 in the widthwise direction v when viewed in the thickness direction z. Thereby, when the sealing resin 7 is molded, since the raised plane 21 abuts on the mold 91 (the abutting surface 912), the resist layer 5 (the pattern covering portion 511) and the mold 91 are in close contact with each other, generating no gap. Therefore, in the molding step, when the resin material is injected into the cavity 93, the pattern covering portion 511 acts as a barrier to suppress resin leakage through the gap. By suppressing the resin leakage, it is possible to secure a path of electrical conduction with an external circuit and to suppress resin burrs.

According to the first embodiment, in the molding step, when the aggregate base 300d is pressed by the mold 91, the raised plane 21 entirely abuts on the abutting surface 912 of the mold 91 and does not abut on the corner portion 913 of the mold 91. That is, the mold 91 can press the support member 2 with a surface. Thereby, a pressing force applied to the raised plane 21 (the pattern covering portion 511) by the mold 91 can be dispersed without being concentrated on the corner portion 913. Therefore, it is possible to prevent resist cracking of the resist layer 5 and prevent intrusion of foreign substances such as water vapor, dust, dirt, etc. In addition, since steam explosion or the like can be prevented by preventing intrusion of water vapor, it is possible to prevent the sealing resin 7 from being peeled off.

According to the first embodiment, in the molding step, the raised plane 21 (the pattern covering portion 511) and the mold 91 (the abutting surface 912) extend from the second base side surface 35 to the second base side surface 36 in the widthwise direction y when viewed in the thickness direction z so as to make contact with each other, thereby preventing resin leakage. In a conventional semiconductor light emitting device molding step, since resin leakage out of the gap is prevented by increasing a mold clamping force at the time of inserting resin between molds in pair, resist cracks are likely to occur due to the increased mold clamping force. In contrast, in the semiconductor light emitting device A1 of the first embodiment, resin leakage can be prevented without increasing the mold clamping force of the pair of molds 91 and 92, unlike the conventional case. That is, in the semiconductor light emitting device A1, it is possible to prevent resin leakage while preventing resist cracks. Furthermore, it is unnecessary to use a molding machine capable of pressing with a high mold clamping force, which can contributes to a reduction in manufacturing costs.

According to the first embodiment, in the resist forming step, the film-shaped resist is used for the base main surface side resist 51. Since the film-shaped resist is adhered by crimping, it is easier to form a flat surface than when applying a liquid resist. Therefore, it is easy to flatten the surface of the pattern covering portion 511 facing the front in the thickness direction z, that is, it is easy to form the raised plane 21, thereby enhancing the adhesion with the mold 91 (the abutting surface 912) without requiring a high mold clamping force for the molding step. Furthermore, the film-shaped resist has higher patterning accuracy than the liquid resist. Therefore, when the film-shaped resist is used, the pattern covering portion 511 (the raised plane 21) can be arranged more accurately than the liquid resist. However, even in the case of a liquid resist, the base main surface side resist 51 may be formed by a liquid solder resist as long as a patterning equivalent to the film-shaped resist is possible.

According to the first embodiment, the surface of the pattern covering portion 511 in the front in the thickness direction z corresponds to the raised plane 21 and the pattern covering portion 511 (the resist layer 5) abuts the mold 91 (the abutting surface 912) in the molding step. Accordingly, the wiring pattern 4 does not abut the mold 91. Therefore, the mold clamping force of the molds 91 and 92 is not directly applied to the wiring pattern 4 and the resist layer 5 acts as a buffer to prevent disconnection of the wiring pattern 4.

Hereinafter, other embodiments of the semiconductor light emitting device according to the present disclosure will be described. In the following embodiments, the same or similar elements and portions as those of the semiconductor light emitting device A1 are denoted by the same reference numeral and explanation thereof will not be repeated for the purpose of brevity.

Figure 15:
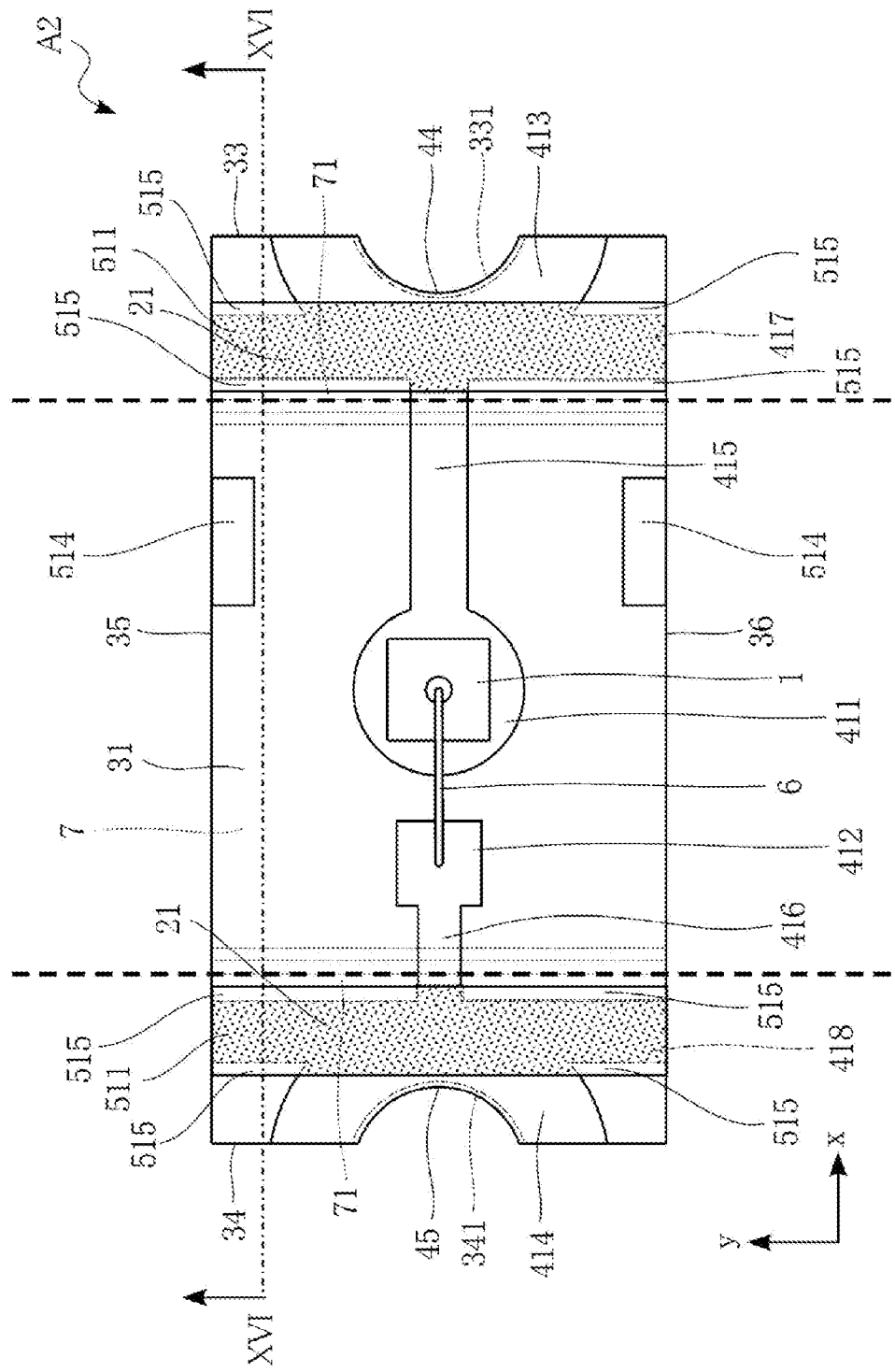
FIG. 15 is a plan view of a semiconductor light emitting device according to a second embodiment of the present disclosure.
Figure 16:
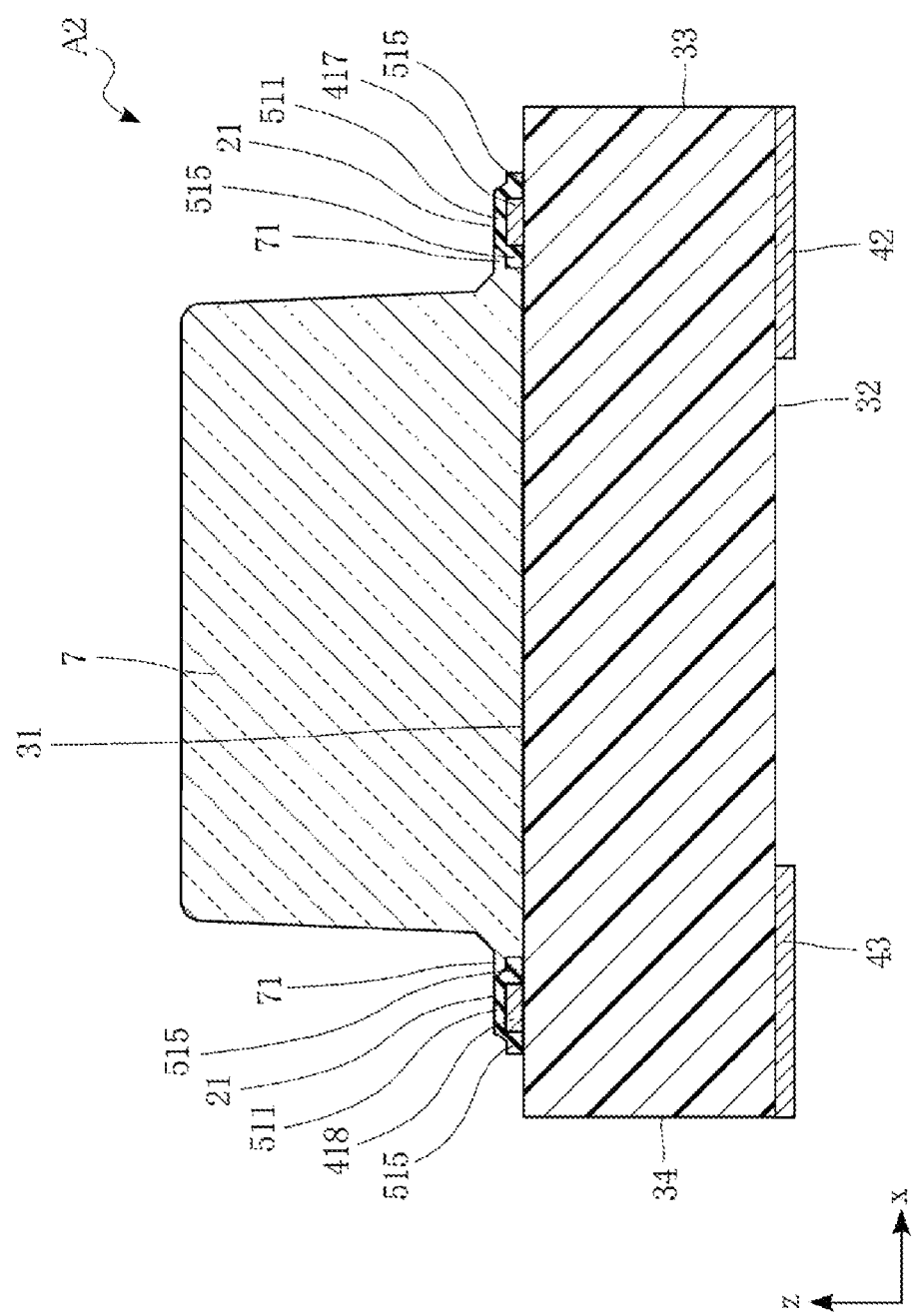
FIG. 16 is a cross-sectional view taken along line XVI-XVI FIG. 15.

FIGS. 15 and 16 illustrate a semiconductor light emitting device A2 according to a second embodiment of the present disclosure. FIG. 15 is a plan view of the semiconductor light emitting device A2. In FIG. 15, the sealing resin 7 is shown in phantom and the position of the corner portion 913 of the mold 91 in the molding step is indicated by a thick broken line. Further, in FIG. 15, a portion corresponding to the raised plane 21 is hatched. FIG. 16 is a cross-sectional view taken along line XVI-XVI in FIG. 15. The sealing resin 7 is shown in FIG. 16.

The semiconductor light emitting device A2 of the second embodiment is different from the semiconductor light emitting device A1 in that the base covering portion 513 is connected to the pattern covering portion 511 in the resist layer 5 (the base main surface side resist 51), as shown in FIGS. 15 and 16.

In the semiconductor light emitting device A2, the base main surface side resist 51 includes the pattern covering portion 511 and the base covering portion 513. The base covering portion 513 includes the polarity determination mark portion 514 and a covering continuation portion 515.

In the semiconductor light emitting device A2, the pattern covering portion 511 covers all of the first extending portion 417 and the second extending portion 418.

The covering continuation portion 515 is a portion of the base covering portion 513 connected to the pattern covering portion 511. In the second embodiment, a plurality of covering continuation portions 515 is formed, each of which is connected to each edge of the pattern covering portion 511 in the lengthwise direction x. A surface of the covering continuation portion 515 facing the front in the thickness direction z is located on the rear side of the surface (that is, the raised plane 21) of the pattern covering portion 511 facing the front in the thickness direction z. In the second embodiment, as shown in FIG. 16, a portion of the covering continuation portion 515 includes a portion that abuts the protruding portion 71 of the sealing resin 7 in the thickness direction z.

According to the second embodiment, the semiconductor light emitting device A2 has the raised plane 21 (the pattern covering portion 511) and can achieve the same effects as those of the first embodiment.

Furthermore, according to the second embodiment, the pattern covering portion 511 is formed so as to cover all of the first extending portion 417 and the second extending portion 418 in the base main surface side resist 51, and includes the covering continuation portion 515 connected to the pattern covering portion 511. The resist layer 5 has higher bondability with the base 3 than that of the wiring pattern 4 and high bondability with the sealing resin 7. Accordingly, the covering continuation portion 515 can prevent the resist layer 5 from being peeled off from the base 3 (the wiring pattern 4). In addition, it is possible to prevent the sealing resin 7 from being peeled off from the support member 2.

In the second embodiment, a case of forming the covering continuation portion 515 on both of the first extending portion 417 and the second extending portion 418 in the lengthwise direction x has been illustrated above, but the covering continuation portion 515 may be formed on only one of the first and second extending portions 417 and 418.

Figure 17:
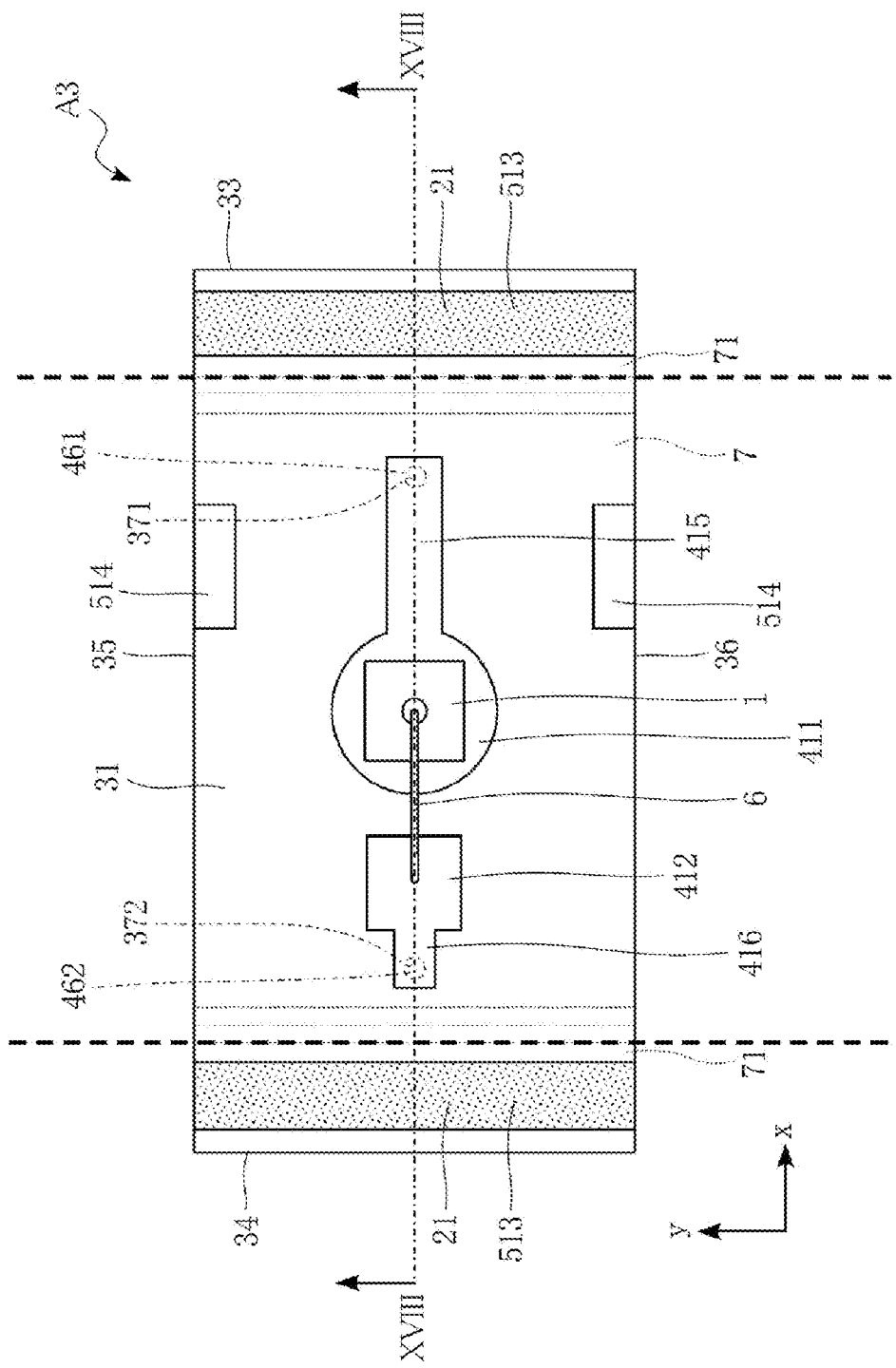
FIG. 17 is a plan view of a semiconductor light emitting device according to a third embodiment of the present disclosure.
Figure 18:
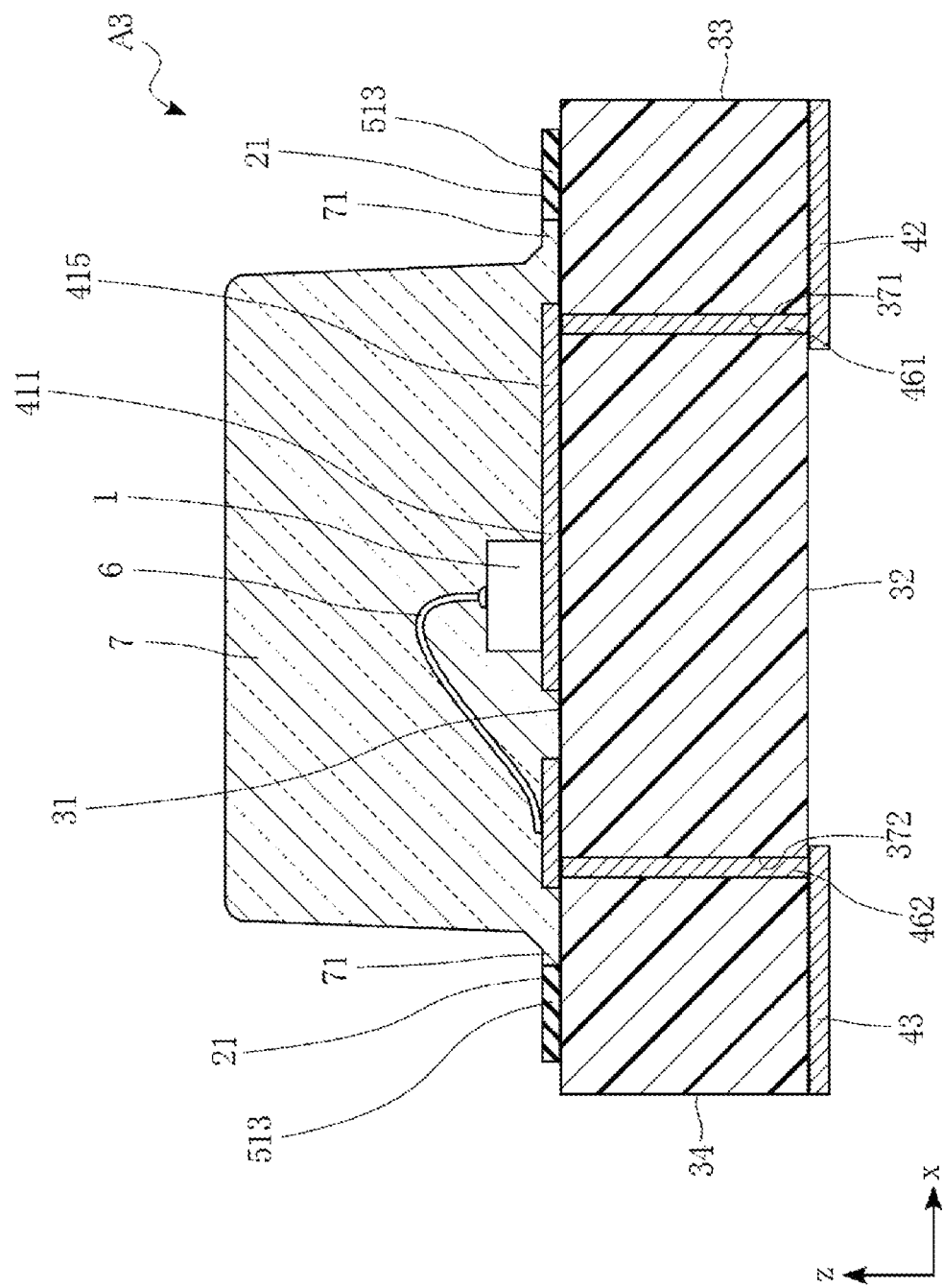
FIG. 18 is a cross-sectional view taken along line XVII-XVII in FIG. 17.

FIGS. 17 and 18 illustrate a semiconductor light emitting device A3 according to a third embodiment of the present disclosure. FIG. 17 is a plan view of the semiconductor light emitting device A3. In FIG. 17, the sealing resin 7 is shown in phantom and the position of the corner portion 913 of the mold 91 in the molding step is indicated by a thick broken line. Further, in FIG. 17, a portion corresponding to the raised plane 21 is hatched. FIG. 18 is a cross-sectional view taken along line XVIII-XVIII in FIG. 17. The sealing resin 7 is shown in FIG. 18.

The semiconductor light emitting device A3 of the third embodiment is different from the semiconductor light emitting device A1 in that the main surface electrode 41 and the back surface electrodes 42 and 43 are electrically connected not by the side surface electrodes 44 and 45 but through vias, as shown in FIG. 18. In addition, the semiconductor light emitting device A3 does not include the pattern covering portion 511 in the resist layer 5, as shown in FIGS. 17 and 18.

In the semiconductor light emitting device A3, the base 3 includes a first through-hole 371 and a second through-hole 372. The first through-hole 371 and the second through-hole 372 extend from the base main surface 31 to the base back surface 32. The first through-hole 371 overlaps with the first connecting portion 415 when viewed in the thickness direction z. The second through-hole 372 overlaps with the second connecting portion 416 when viewed in the thickness direction z.

In the semiconductor light emitting device A3, the wiring pattern 4 includes through-electrodes 461 and 462. The through-electrodes 461 and 462 are made of a conductive material.

The through-electrode 461 is filled in the first through-hole 371. An edge of the through-electrode 461 in the front side in the thickness direction z is in contact with the first connecting portion 415 and an edge thereof in the rear side in the thickness direction z is in contact with the back surface electrode 42. Accordingly, the through-electrode 461 makes electrical conduction with the first connecting portion 415 and the back surface electrode 42. The first through-hole 371 and the through-electrode 461 form a via.

The through-electrode 462 is filled in the second through-hole 372. An edge of the through-electrode 462 in the front side in the thickness direction z is in contact with the second connecting portion 416 and an edge thereof in the rear side in the thickness direction z is in contact with the back surface electrode 43. Accordingly, the through-electrode 462 makes electrical conduction with the second connecting portion 416 and the back surface electrode 43. The second through-hole 372 and the through-electrode 462 form a via.

The positions of the first through-hole 371, the second through-hole 372 and the through-electrodes 461 and 462 are not limited thereto. For example, the first through-hole 371 and the through-electrode 461 may be disposed at a position overlapping the die bonding portion 411 in the thickness direction z. In this case, it is necessary to extend the back surface electrode 42 to a position where it overlaps the die bonding portion 411 in the lengthwise direction x when viewed in the thickness direction z. Similarly, the second through-hole 372 and the through-electrode 462 may be disposed at a position overlapping the wire bonding portion 412 when viewed in the thickness direction z.

In the semiconductor light emitting device A3, the main surface electrode 41 and the back surface electrodes 42 and 43 are electrically connected by using the through-electrodes 461 and 462. Therefore, in the third embodiment, as shown in FIGS. 17 and 18, the semiconductor light emitting device A3 does not include the through-hole portions 331 and 341 and the side surface electrodes 44 and 45, as shown in FIGS. 17 and 18.

In the semiconductor light emitting device A3, the base covering portion 513 of the base main surface side resist 51 is disposed on both edges of the base main surface 31 in the lengthwise direction x. As shown in FIG. 17, the base covering portion 513 has a rectangular shape when viewed in the thickness direction z. In addition, the base covering portion 513 extends from the second base side surface 35 to the second base side surface 36 in the widthwise direction y when viewed in the thickness direction z, in addition, as shown in FIG. 18, the base covering portion 513 is located outside the sealing resin 7 in the lengthwise direction x and is exposed from the sealing resin 7. Further, as shown in FIGS. 17 and 18, the base covering portion 513 is in contact with the edge of the sealing resin 7 in the lengthwise direction x. As shown in FIG. 18, the base covering portion 513 is located at the most front side of the support member 2 in the thickness direction z and protrudes forward from the base main surface 31 in the thickness direction z. Therefore, in the third embodiment, the surface of the base covering portion 513 facing the front in the thickness direction z corresponds to the raised plane 21.

According to the third embodiment, since the semiconductor light emitting device A3 includes the raised plane 21 (the base covering portion 513), and the raised plane 21 and the abutting surface 912 of the mold 91 are in close contact with each other, as in the first embodiment, the base covering portion 513 acts as a barrier to suppress resin leakage. In addition, since the raised plane 21 does not abut the corner portion 913 of the mold 91, it is possible to prevent resist cracking without a pressing force being concentrated on the corner portion 913.

In the above third embodiment, a case where the surface of the base covering portion 513 facing the front in the thickness direction z forms the raised plane 21 has been illustrated above, but the wiring pattern 4 (the main surface electrode 41) may be arranged instead of the base covering portion 513. In this case, the surface of a portion of the main surface electrode 41 facing the front in the thickness direction z corresponds to the raised plane 21. That is, the portion of the main surface electrode 41 corresponds to the raised plane 21.

Figure 19:
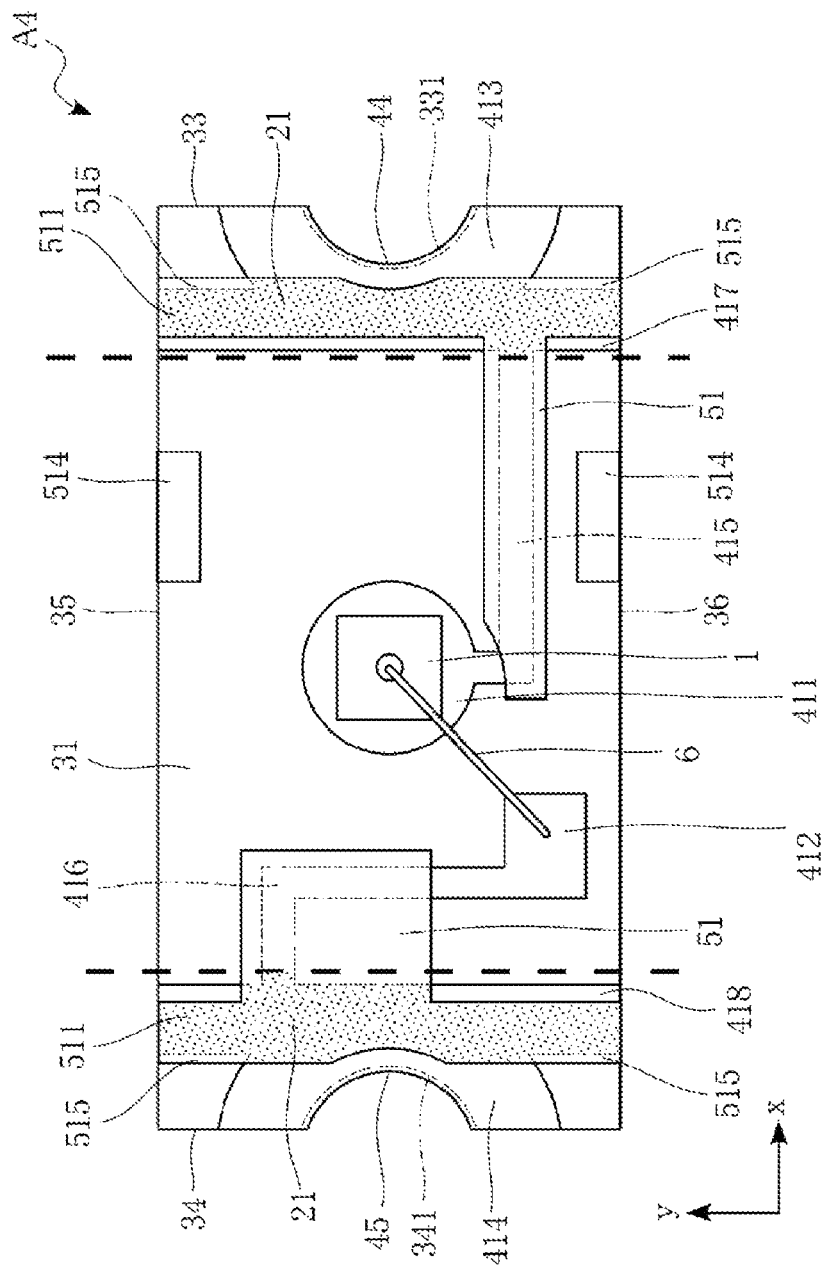
FIG. 19 is a plan view of a semiconductor light emitting device according to a fourth embodiment of the present disclosure.

FIG. 19 illustrates a semiconductor light emitting device A4 according to a fourth embodiment of the present disclosure. FIG. 19 is a plan view of the semiconductor light emitting device A4, in FIG. 19, the sealing resin 7 is not shown, and the position of the corner portion 913 of the mold 91 in the molding step is indicated by a thick broken line. Further, in FIG. 19, a portion corresponding to the raised planes 21 is hatched.

In the semiconductor light emitting device A4 according to the fourth embodiment, as shown in FIG. 19, the first connecting portion 415 and the second connecting portion 416 are bent instead of being linearly extended in the lengthwise direction x.

In the semiconductor light emitting device A4, as shown in FIG. 19, the first connecting portion 415 extends backward from the first extending portion 417 in the lengthwise direction x and is bent forward in the widthwise direction y to be connected to the die bonding portion 411. As shown in FIG. 19, the second connecting portion 416 extends forward from the second extending portion 418 in the lengthwise direction x and is bent backward in the widthwise direction y to be connected to the wire bonding portion 412. The shapes of the first connecting portion 415 and the second connecting portion 416 are not limited to those described above.

In the semiconductor light emitting device A4, the first connecting portion 415 and the second connecting portion 416 are longer by a bent length than the semiconductor light emitting device A1 and an area of the base main surface 31 occupied by the first connecting portion 415 and the second connecting portion 416 is increased. As described in the second embodiment, since the sealing resin 7 has higher bondability with the resist layer 5 than the wiring pattern 4, a region where the resist layer 5 (the base main surface side resist 51) is formed is increased to increase the bondability between the sealing resin 7 and the support member 2 as illustrated in FIG. 19. Specifically, the base main surface side resist 51 is formed so as to cover a portion of the first connecting portion 415 and a portion of the second connecting portion 416.

According to the fourth embodiment, the semiconductor light emitting device A4 has the raised plane 21 (the pattern covering portion 511) and can achieve the same effects as those of the first embodiment.

Furthermore, according to the fourth embodiment, by bending the first connecting portion 415 and the second connecting portion 416, various bonding materials can be prevented from being exuded and a short circuit of the wiring pattern 4 can be prevented. For example, when a thermosetting resin is used as the material of the sealing resin 7, heat may be applied to cure the sealing resin 7. Due to this heating, there is a possibility that various bonding materials (for example, Ag paste or solder) are re-melt and exuded to make a short-circuit between wiring patterns 4 at an unintended place. Therefore, even when the bonding materials are exuded by bending the first connecting portion 415 and the second connecting portion 416, the wiring pattern 4 can act as a barrier to prevent an unintended short circuit.

In the fourth embodiment, a portion where a portion of the resist layer 5 (the pattern covering portion 511) abuts the corner portion 913 occurs in the molding step (see a thick dotted line in FIG. 19). Therefore, a slit or a recess may be formed in a portion of the pattern covering portion 511 on which the corner portion 913 abuts, so that the corner portion 913 does not abut the raised plane 21.

Figure 20:
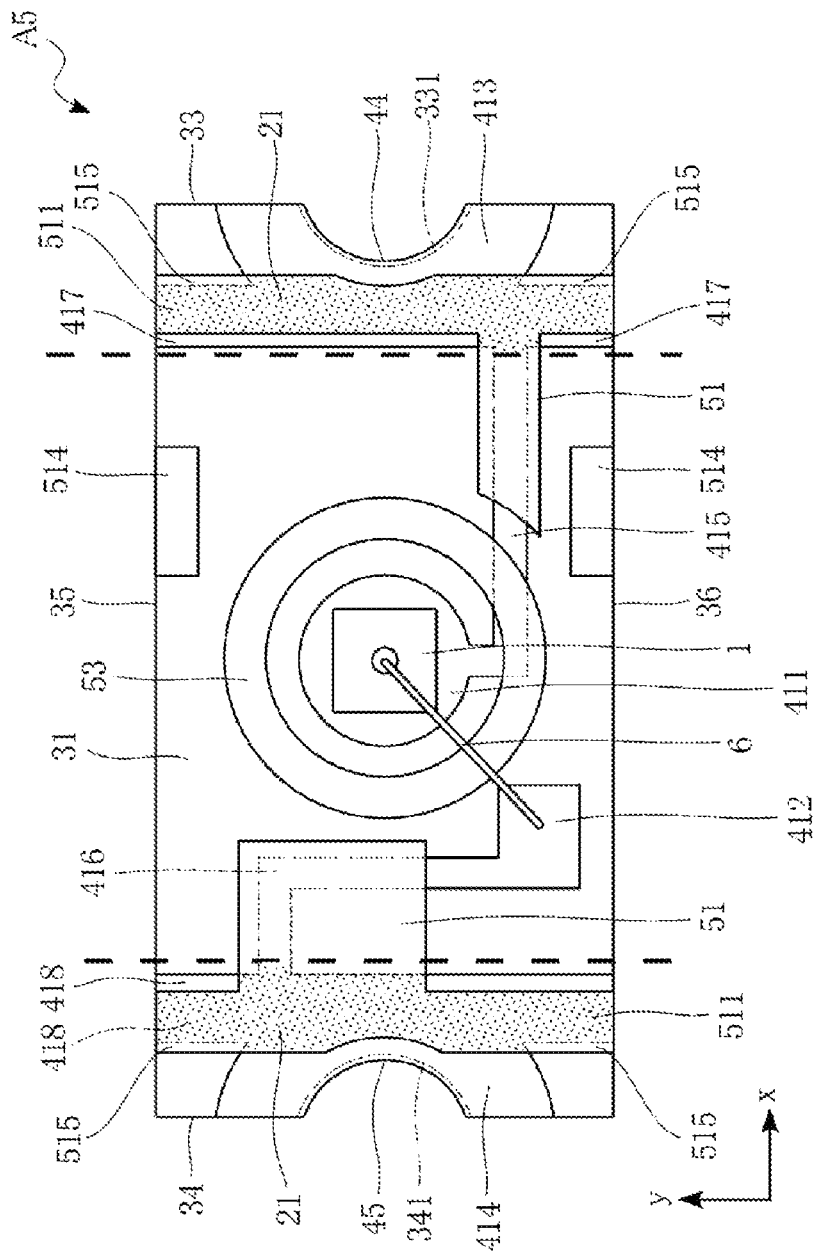
FIG. 20 is a plan view of a semiconductor light emitting device according to a fifth embodiment of the present disclosure.

FIG. 20 illustrates a semiconductor light emitting device A5 according to a fifth embodiment of the present disclosure. FIG. 20 is a plan view of the semiconductor light emitting device A5. In FIG. 20, the sealing resin 7 is not shown and the position of the corner portion 913 of the mold 91 in the molding step is indicated by a thick broken line. Further, in FIG. 20, a portion corresponding to the raised planes 21 is hatched.

As shown in FIG. 20, the semiconductor light emitting device A5 according to the fifth embodiment further includes an annular portion 53 as compared with the semiconductor light emitting device A4.

The annular portion 53 is a ring-shaped portion that surrounds the die bonding portion 411 in the resist layer 5 (the base main surface side resist 51). In the fifth embodiment, the annular portion 53 is formed of a white resist. In addition, by further providing the annular portion 53, the shape of a portion (covering the first connecting portion 415) of the resist layer 5 (the base main surface side resist 51) is changed.

The fifth embodiment can achieve the same effects as those of the fourth embodiment.

Furthermore, according to the fifth embodiment, the annular portion 53 can act as a barrier to prevent various bonding materials from being exuded, thereby preventing an unintended short circuit of the wiring pattern 4. For example, even when a solder or an Ag paste is re-melted when the semiconductor light emitting element 1 is die-bonded, the annular portion 53 acts as a barrier to prevent the bonding materials from being exuded around. On the contrary, it is also possible to prevent the bonding materials from being exuded from the outside to the inside of the annular portion 53. Furthermore, since the annular portion 53 is formed of a white resist, it is possible to reflect light emitted from the semiconductor light emitting element 1, thereby enhancing the brightness of the semiconductor light emitting device A5.

In the fifth embodiment, a case where the annular portion 53 is further provided in the semiconductor light emitting device A4 according to the fourth embodiment has been illustrated above. However, the present disclosure is not limited thereto but the annular portion 53 may be further provided in the semiconductor light emitting devices A1 to A3 according to the first to third embodiments. Even in this case, the above-described effects can be achieved.

FIGS. 21 and 22 illustrate a semiconductor light emitting device A6 according to a sixth embodiment of the present disclosure. FIG. 21 is a plan view of the semiconductor light emitting device A6. In FIG. 21, the sealing resin 7 is shown in phantom and the position of the corner portion 913 of the mold 91 in the molding step is indicated by a thick broken line. Further, in FIG. 21, a portion corresponding to the raised plane 21 is hatched. FIG. 22 is a cross-sectional view taken along line XXII-XXII in FIG. 21. The sealing resin 7 is shown in FIG. 22.

As shown in FIGS. 21 and 22, the semiconductor light emitting device A6 according to the sixth embodiment does not have the pattern covering portion 511 formed on the wiring pattern 4 in the resist layer 5. In the sixth embodiment, the first connecting portion 415 and the second connecting portion 416 are bent with shapes different from those of the fourth and fifth embodiments.

In the semiconductor light emitting device A6, the base 3 does not have the through-hole portions 331 and 341 in the first base side surfaces 33 and 34, and the side surface electrodes 44 and 45 of the wiring pattern 4 cover both of the first base side surfaces 33 and 34, respectively. In the semiconductor light emitting device A6, as in the first embodiment, the through-hole portions 331 and 341 may be provided, and the side surface electrodes 44 and 45 may be formed so as to cover the through-hole portions 331 and 341.

In the semiconductor light emitting device A6, the first edge portion 413 and the second edge portion 414 of the wiring pattern 4 are rectangular when viewed in the thickness direction z, and extend from the second base side surface 35 to the second base side surface 36 in the widthwise direction y. In the sixth embodiment, the first edge portion 413 and the second edge portion 414 have a portion located outside the sealing resin 7 when viewed in the thickness direction z, a part of which is exposed from the sealing resin 7. Further, as shown in FIG. 22, the surfaces of the first edge portion 413 and the second edge portion 414 facing the front in the thickness direction z are located at the most front side of the support member 2 in the most thickness direction z. Accordingly, in the semiconductor light emitting device A6, the surfaces of the first edge portion 413 and the second edge portion 414 facing the front in the thickness direction z correspond to the raised plane 21. That is, a portion of the wiring pattern 4 forms the raised plane 21.

According to the sixth embodiment, the semiconductor light emitting device A6 includes the raised plane 21 (the first edge portion 413 and the second edge portion 414 of the wiring pattern 4). Accordingly, resin leakage can be prevented. Further, according to the sixth embodiment, since the raised plane 21 is a portion of the wiring pattern 4 rather than the resist layer 5, it is possible to prevent cracking of the wiring pattern 4 rather than the resist layer 5.

Figure 23A:
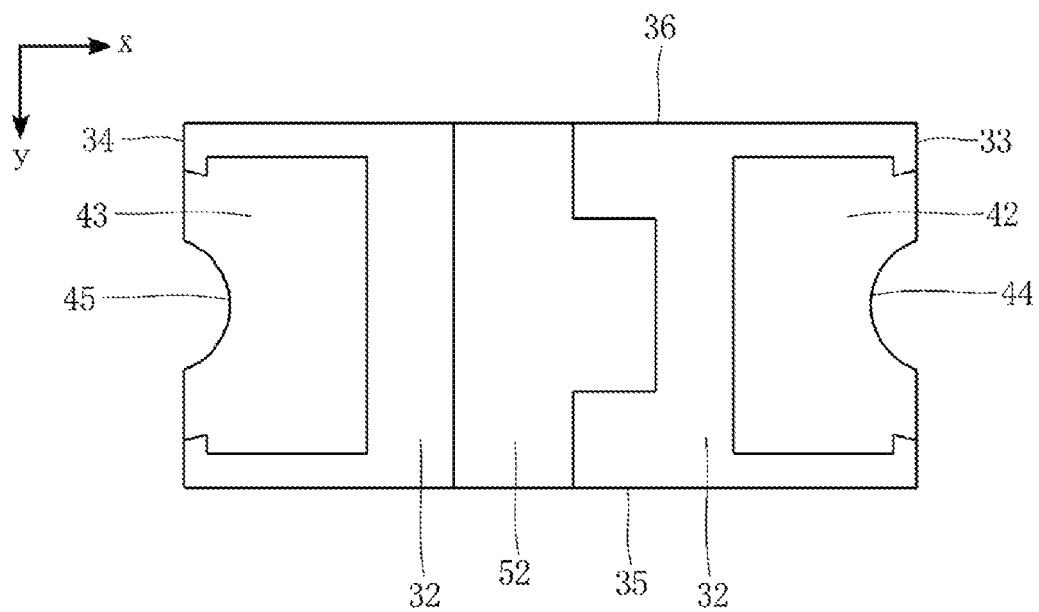
FIGS. 23A and 23B are views for explaining a semiconductor light emitting device according to a modification of the present disclosure.
Figure 23B:
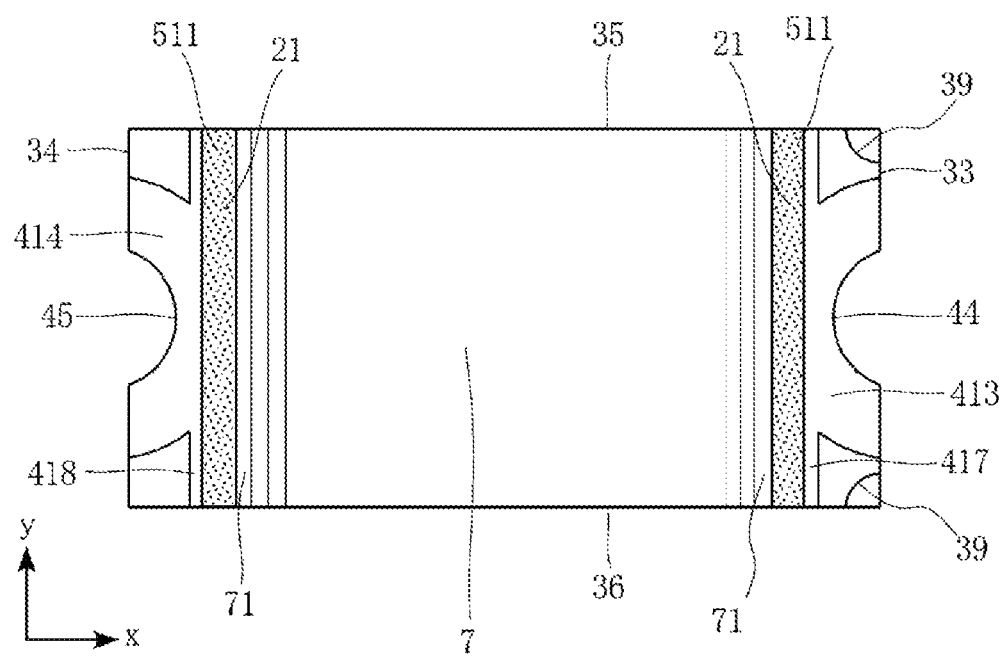

In the above-described first to sixth embodiments, a case where the polarity determination mark portion 514 of the base covering portion 513 is used as a mark for determining the polarity of the semiconductor light emitting devices A1 to A6 has been illustrated above. However, the present disclosure is not limited thereto but may be changed in whatever manner as long as a polarity can be determined. FIGS. 23A and 23B illustrate an example of a case where such a mark for polarity determination is modified.

FIG. 23A illustrates a case where a resist (hereinafter referred to as a "base back surface side resist 52") is provided on the base back surface 32 of the base 3, and the base back surface side resist 52 is used as a mark for polarity determination. FIG. 23A is a bottom view of a semiconductor light emitting device according to a first modification. As shown in FIG. 23A, the base back surface side resist 52 is formed in the vicinity of the center of the base back surface 32 in the lengthwise direction x and extends from one edge to the other edge of the base back surface 32 in the widthwise direction y. Further, the rear surface of the base back surface side resist 52 in the thickness direction z is flat. In the first modification, the base back surface side resist 52 has a convex shape in which the front edge thereof in the lengthwise direction x protrudes forward in the lengthwise direction x when viewed in the thickness direction z. A user can determine the polarity of the semiconductor light emitting device based on the convex base back surface resist 52. Furthermore, since the base back surface side resist 52 is formed between the back surface electrodes 42 and 43, when the semiconductor light emitting device is mounted on a mounting board or the like, the base back surface side resist 52 can act as a barrier to prevent exudation of a solder or the like while preventing a short-circuit between the back surface electrodes 42 and 43. It should be noted that the shape of the base back surface side resist 52 is not limited to the one described above.

FIG. 23B illustrates a case in which a portion of the base 3 is deficient and the deficient portion (hereinafter, referred to as a deficient portion 39) is used as a mark for polarity determination. FIG. 23B is a plan view of a semiconductor light emitting device according to a second modification. As shown in FIG. 23B, when viewed in the thickness direction z, the deficient portion 39 is recessed backward from the base main surface 31 in the thickness direction z on the front side in the lengthwise direction x and on both sides in the widthwise direction y. A user can determine the polarity of the semiconductor light emitting device based on the deficient portion 39 provided on the base 3.

Figure 24:
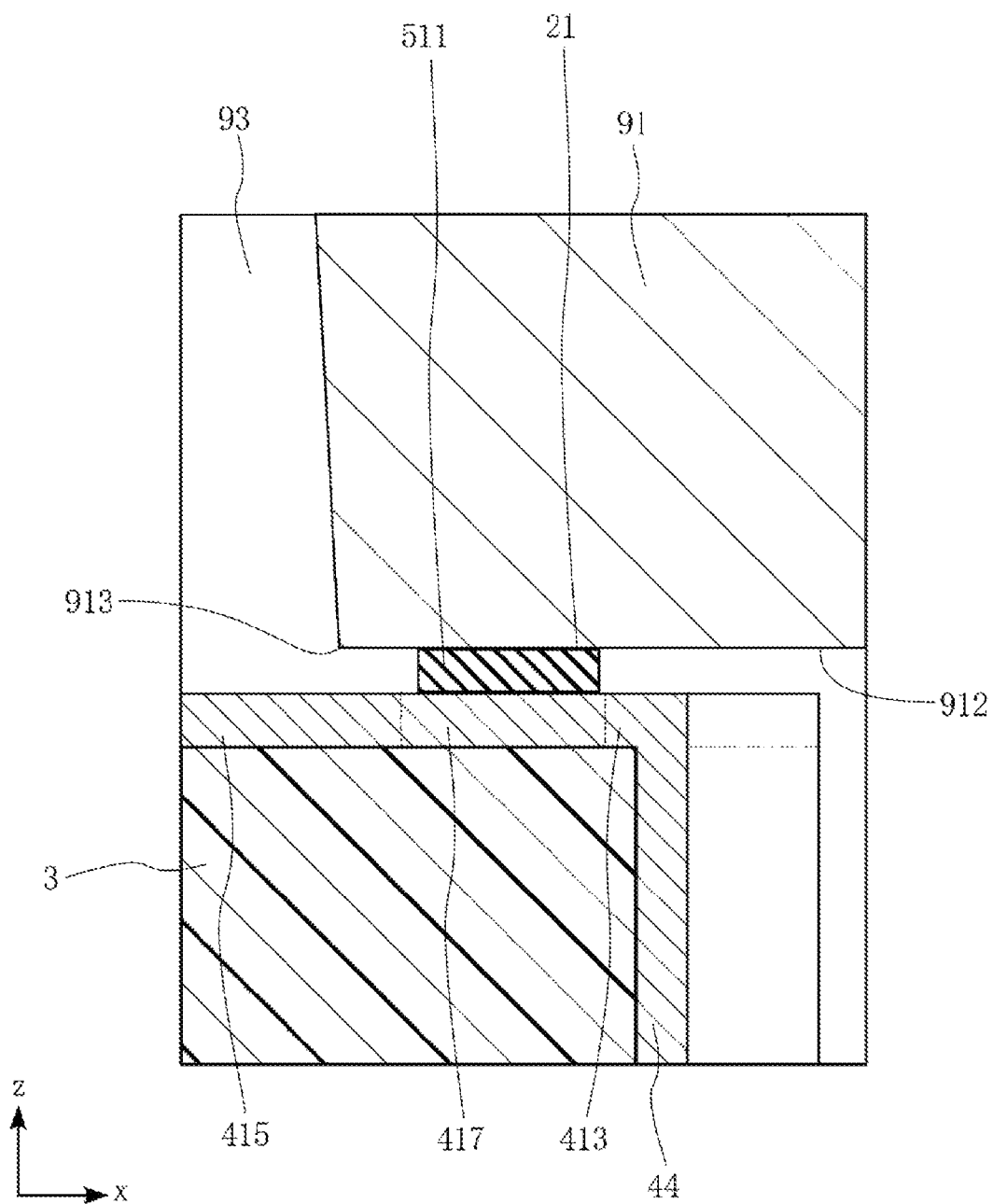
FIG. 24 is a view for explaining a mold according to a modification of the present disclosure.

Although it has been illustrated in the above first to sixth embodiments that the inclined portion 914 is formed in the mold 91, the inclined portion 914 may not be formed. FIG. 24 illustrates a mold 91 without the inclined portion 914. FIG. 24 corresponds to FIG. 13.

In the conventional molding step, since the corner portion 913 abuts the support member 2, a pressure concentrated on the corner portion 913 is relaxed by providing the inclined portion 914 and increasing an angle of the corner portion 913. On the other hand, in the molding step of the present disclosure, since the corner portion 913 does not abut the support member 2 (including the wiring pattern 4 and the resist layer 5) but is pressed by the abutting surface 912, a concentrated pressure by the corner portion 913 is not applied. Accordingly, the angle of the corner portion 913 can be reduced and the inclined portion 914 is not required. Therefore, as shown in FIG. 24, it is not necessary to form the inclined portion 914 in the mold 91.

In the case where the inclined portion 914 is formed, the dimension of the sealing resin 7 in the lengthwise direction x is increased. However, in the second modification, the dimension of the sealing resin 7 in the lengthwise direction x can be reduced. Accordingly, it is possible to reduce the dimension of the support member 2 (the base 3) in the lengthwise direction x and to reduce the size of the semiconductor light emitting device. Alternatively, since the sealing resin 7 can be further extended up to the edge portion of the support member 2 in the lengthwise direction x, it is possible to enhance design freedom of the support member 2 (the wiring pattern 4 and the resist layer 5 onto the base 3).

The semiconductor light emitting device and the method of manufacturing the semiconductor light emitting device according to the present disclosure are not limited to the above-described embodiments and modifications. The specific structures of various portions of the semiconductor light emitting device of the present disclosure and the specific procedures of various steps of the method of manufacturing the semiconductor light emitting device can be changed in design in various ways.

According to the present disclosure in some embodiments, in the semiconductor light emitting device, the support member includes the raised plane which is exposed from the sealing resin and extends from one edge to the other edge in the third direction when viewed in the first direction. Thus, in the molding step, when the support member is inserted in the molds, the mold and the raised plane come into contact with each other so that a gap between the mold and the support member disappears. Therefore, when a resin material is injected into the mold, resin leakage from the gap can be prevented.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light emitting device comprising:
   a semiconductor light emitting element;
   a sealing resin covering the semiconductor light emitting element; and
   a support member that is configured to support the semiconductor light emitting element and the sealing resin, the support member including a base, wherein the base includes:
   a base main surface facing one side of a first direction which is a thickness direction,
   a base back surface facing an other side of the first direction,
   a pair of first base side surfaces opposite to each other in a second direction orthogonal to the first direction, and
   a pair of second base side surfaces opposite to each other in a third direction orthogonal to the first direction and the second direction;
   a wiring pattern formed on the base; and
   a resist layer including a pattern covering portion formed on the wiring pattern,
   wherein the pattern covering portion is entirely spaced apart from the base when viewed in the first direction,
   wherein the pattern covering portion includes a first resist layer and a second resist layer spaced apart from the first resist layer,
   wherein the first resist layer and the second resist layer continuously extend from one edge to an other edge of the support member in the third direction when viewed in the first direction, and
   wherein the first resist layer and the second resist layer are configured to form a raised plane, which is a flat surface raised from the base main surface in the first direction and is exposed from the sealing resin,
   wherein an upper surface of the raised plane is entirely exposed from the sealing resin when viewed in the first direction, and
   wherein an edge of the raised plane is in contact with an edge of the sealing resin in the second direction when viewed in the first direction.

2. The semiconductor light emitting device of claim 1,
   wherein the sealing resin includes a protruding portion protruding in the second direction, and
   wherein a surface of the protruding portion facing in a same direction as a direction in which the base main surface faces is at a same position as a position of the raised plane in the first direction.

3. The semiconductor light emitting device of claim 2,
   wherein the raised plane is located at a most front side in the direction in which the base main surface faces, in a portion of the support member exposed from the sealing resin.

4. The semiconductor light emitting device of claim 1, wherein the wiring pattern includes a main surface electrode formed on the base main surface.

5. The semiconductor light emitting device of claim 4, wherein the raised plane is a portion of the main surface electrode.

6. The semiconductor light emitting device of claim 4, wherein the resist layer is made of an insulating material.

7. The semiconductor light emitting device of claim 6,
   wherein the resist layer further includes a base covering portion formed on the base main surface, and
   wherein the raised plane is a part of the base covering portion.

8. The semiconductor light emitting device of claim 6, wherein the raised plane is a part of the pattern covering portion.

9. The semiconductor light emitting device of claim 8, wherein the wiring pattern includes a pair of back surface electrodes formed on the base back surface and separated from each other.

10. The semiconductor light emitting device of claim 9, further comprising a wire connecting the semiconductor light emitting element and the wiring pattern.

11. The semiconductor light emitting device of claim 10, wherein the main surface electrode includes:

a die bonding portion to which the semiconductor light emitting element is die-bonded, and a wire bonding portion which is electrically conducted with the semiconductor light emitting element via the wire.

12. The semiconductor light emitting device of claim 11, wherein the wiring pattern includes a pair of side surface electrodes formed on the first base side surfaces and connecting the main surface electrode and the back surface electrodes.

13. The semiconductor light emitting device of claim 11, wherein each of the first base side surfaces includes a through-hole recessed in the second direction and penetrating from the base main surface to the base back surface, and wherein the wiring pattern includes a pair of side surface electrodes formed on a surface of the through-hole.

14. The semiconductor light emitting device of claim 12, wherein the main surface electrode includes: a pair of edge portions connected to the side surface electrodes in the first direction, and a pair of connecting portions, one connecting portion connecting the die bonding portion and one of the edge portions and the other connecting portion connecting the wire bonding portion and an other of the edge portions.

15. The semiconductor light emitting device of claim 14, wherein the main surface electrode is connected to the connecting portions and further includes a pair of extending portions extending from one edge of the base main surface to the other edge of the base main surface in the third direction when viewed in the first direction.

16. The semiconductor light emitting device of claim 15, wherein the raised plane is a part of the pattern covering portion formed on the extending portions.

17. The semiconductor light emitting device of claim 11, wherein the resist layer includes an annular portion surrounding a periphery of the die bonding portion when viewed in the first direction.

18. A method of manufacturing the semiconductor light emitting device of claim 1, comprising:

forming the support member including the raised plane; bonding the semiconductor light emitting element to the support member; and molding the sealing resin by inserting the support member in a pair of molds in the first direction and injecting a resin material into a cavity inside the molds, 5 wherein, before the act of molding the sealing resin, in consideration of a mold pressing region on which the molds abut, the act of forming the support member is performed such that the raised plane extends continuously from one edge to an other edge of the mold pressing region in the third direction.

19. The method of claim 18, wherein the act of forming the support member includes:

providing the base;

forming the wiring pattern on the base; and forming the resist layer, wherein the forming of the resist layer includes forming the resist layer by crimping, adhering and curing a film-shaped resist.

20. The semiconductor light emitting device of claim 1, wherein the pattern covering portion extends continuously from a first edge to a second edge of the wiring pattern in the third direction.

21. The semiconductor light emitting device of claim 1, wherein the sealing resin includes a surface that is flush with a surface of the resist layer.

* * * * *